(12) United States Patent
Chen et al.

(10) Patent No.: US 8,839,067 B2
(45) Date of Patent: Sep. 16, 2014

(54) APPARATUS AND METHOD FOR ACCELERATING THE ENCODING OF RAPTOR CODES

(71) Applicant: Industrial Technology Research Institute, Hsinchu (TW)

(72) Inventors: Shiuan-Tung Chen, New Taipei (TW); Hsin-Ta Chiao, Nantou County (TW); Hung-Min Sun, Hsinchu (TW); Chia-Hsing Ho, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 159 days.

(21) Appl. No.: 13/726,809

(22) Filed: Dec. 26, 2012

(65) Prior Publication Data

US 2014/0068386 A1    Mar. 6, 2014

(30) Foreign Application Priority Data

Aug. 31, 2012 (TW) .............................. 101131875 A

(51) Int. Cl.
*H03M 13/00* (2006.01)
*H03M 13/37* (2006.01)
*H03M 13/05* (2006.01)

(52) U.S. Cl.
CPC .......... *H03M 13/05* (2013.01); *H03M 13/3761* (2013.01); *H03M 13/611* (2013.01); *H03M 13/6561* (2013.01)
USPC .......................................................... 714/752

(58) Field of Classification Search
None
See application file for complete search history.

(56) References Cited

U.S. PATENT DOCUMENTS

| | | | | |
|---|---|---|---|---|
| 7,293,222 B2* | 11/2007 | Shokrollahi et al. | .......... | 714/777 |
| 7,418,651 B2* | 8/2008 | Luby et al. | .................... | 714/800 |
| 7,532,132 B2 | 5/2009 | Shokrollahi et al. | | |
| 7,577,898 B2 | 8/2009 | Costa et al. | | |
| 7,594,154 B2* | 9/2009 | Vedantham et al. | .......... | 714/752 |
| 7,711,068 B2 | 5/2010 | Shokrollashi et al. | | |
| 7,849,384 B2 | 12/2010 | Costa et al. | | |
| 8,233,532 B2* | 7/2012 | Wiegand et al. | ......... | 375/240.02 |
| 8,301,974 B2* | 10/2012 | Abu-Surra et al. | ........... | 714/758 |
| 8,370,700 B2* | 2/2013 | Xu et al. | ....................... | 714/752 |
| 2007/0195894 A1* | 8/2007 | Shokrollahi et al. | ......... | 375/242 |
| 2008/0028275 A1* | 1/2008 | Chen et al. | .................... | 714/752 |

(Continued)

OTHER PUBLICATIONS

Tarable, A; Benedetto, S., "Efficiency of Precode-Only Raptor codes and Turbo-Fountain Codes," Information Theory Workshop, 2006. ITW '06 Chengdu. IEEE , vol., No., pp. 61,65, Oct. 22-26, 2006.*

(Continued)

*Primary Examiner* — Steve Nguyen
(74) *Attorney, Agent, or Firm* — Lin & Associates IP, Inc.

(57) ABSTRACT

In one exemplary embodiment of an apparatus for accelerating the encoding of Raptor codes, based on an inputted block length, a pre-encoding matrix generation device determines to generate an encoding matrix M corresponding to the inputted block length and computes an inverse matrix $M^{-1}$, or makes a pre-coding operation list storage device output an operation list corresponding to the inputted block length; based on the encoding matrix or the inverse matrix $M^{-1}$, a pre-encoding operation list generation device generates a new operation list; based on one of the aforementioned two operation lists and an inputted source symbol set, at least one prompt intermediate symbol generation device generates at least one intermediate symbol set to provide to a fountain code encoder for encoding.

24 Claims, 25 Drawing Sheets

(56) References Cited

U.S. PATENT DOCUMENTS

| | | |
|---|---|---|
| 2008/0069242 A1 | 3/2008 | Xu et al. |
| 2010/0100791 A1 | 4/2010 | Abu-Surra et al. |
| 2012/0128009 A1* | 5/2012 | Yang et al. .................... 370/432 |

OTHER PUBLICATIONS

Zeineddine, H.; Mansour, M.M.; Puri, R., "Construction and Hardware-Efficient Decoding of Raptor Codes," Signal Processing, IEEE Transactions on , vol. 59, No. 6, pp. 2943,2960, Jun. 2011.*

Saejoon Kim; Ko, K.; Sae-Young Chung, "Incremental Gaussian elimination decoding of raptor codes over BEC," Communications Letters, IEEE , vol. 12, No. 4, pp. 307,309, Apr. 2008.*

Heo, J.; Kim, S.W.; Kim, J. Y., "Efficient Decoding Algorithm for Raptor Codes for Multimedia Broadcast Services," Consumer Electronics, 2008. ICCE 2008. Digest of Technical Papers. International Conference on , vol., No., pp. 1,2, Jan. 9-13, 2008.*

LT Codes, Michael Luby, Proceedings of the 43 rd Annual IEEE Symposium on Foundations of Computer Science (FOCS'02).

Raptor Codes, Amin Shokrollahi, Senior Member, IEEE, IEEE Transactions on Information Theory, vol. 52, No. 6, Jun. 2006, p. 2551-2567.

Incremental Gaussian Elimination Decoding of Raptor Codes over BEC Saejoon Kim, Member, IEEE, Karam Ko, and Sae-Young Chung, Senior Member, IEEE, IEEE Communications Letters, vol. 12, No. 4, Apr. 2008, p. 307-309.

An Improved Algorithm of 3GPP MBMS Raptor codes, Zhang Quan, Xu Weizhang, Shi Dongxin, Yang Zhanxin, 2010 International Conference on Measuring Technology and Mechatronics Automation, p. 492-495.

Efficient Decoding Algorithm for Raptor Codes for Multimedia Broadcast Services, J. Heo, Member, IEEE, S. W. Kim, and J. Y. Kim, Member, 2008 IEEE.

Degree Distribution Optimization in Raptor Network Coding, Nikolaos Thomos and Pascal Frossard, 2011 IEEE International Symposium on Information Theory Proceedings, p. 2736-2740.

* cited by examiner $$
\begin{bmatrix} y_{i,1} \\ y_{i,2} \\ y_{i,3} \\ y_{i,4} \\ y_{i,5} \\ y_{i,6} \\ y_{i,7} \\ y_{i,8} \\ y_{i,9} \\ y_{i,10} \\ y_{i,11} \\ y_{i,12} \\ y_{i,13} \\ y_{i,14} \\ y_{i,15} \\ y_{i,16} \\ y_{i,17} \\ y_{i,18} \\ y_{i,19} \\ y_{i,20} \end{bmatrix} = \begin{bmatrix} y_{i,1}+y_{i,2}+y_{i,3}+y_{i,4}+y_{i,9}+y_{i,10}+y_{i,13}+y_{i,18}+y_{i,19} \\ y_{i,1}+y_{i,2}+y_{i,3}+y_{i,4}+y_{i,5}+y_{i,6}+y_{i,9}+y_{i,10}+y_{i,15}+y_{i,16}+y_{i,17}+y_{i,20} \\ y_{i,1}+y_{i,5}+y_{i,6}+y_{i,7}+y_{i,9}+y_{i,11}+y_{i,14}+y_{i,20} \\ y_{i,14}+y_{i,17} \\ y_{i,1}+y_{i,2}+y_{i,3}+y_{i,4}+y_{i,5}+y_{i,7}+y_{i,12}+y_{i,13}+y_{i,14}+y_{i,16}+y_{i,18}+y_{i,19}+y_{i,20} \\ y_{i,1}+y_{i,4}+y_{i,5}+y_{i,6}+y_{i,9}+y_{i,11}+y_{i,12}+y_{i,14}+y_{i,15}+y_{i,19} \\ y_{i,1}+y_{i,4}+y_{i,5}+y_{i,6}+y_{i,10}+y_{i,13}+y_{i,14}+y_{i,17}+y_{i,18}+y_{i,19}+y_{i,20} \\ y_{i,2}+y_{i,3}+y_{i,4}+y_{i,11}+y_{i,12}+y_{i,15}+y_{i,17}+y_{i,19}+y_{i,20} \\ y_{i,1}+y_{i,2}+y_{i,4}+y_{i,10}+y_{i,14}+y_{i,15}+y_{i,16} \\ y_{i,7}+y_{i,9}+y_{i,11}+y_{i,13}+y_{i,14}+y_{i,15}+y_{i,16}+y_{i,17}+y_{i,18}+y_{i,19} \\ y_{i,1}+y_{i,2}+y_{i,7}+y_{i,10}+y_{i,11}+y_{i,15}+y_{i,16} \\ y_{i,1}+y_{i,2}+y_{i,4}+y_{i,5}+y_{i,6}+y_{i,9}+y_{i,11}+y_{i,13}+y_{i,14}+y_{i,16}+y_{i,17}+y_{i,18}+y_{i,19} \\ y_{i,2}+y_{i,3}+y_{i,7}+y_{i,9}+y_{i,11}+y_{i,13}+y_{i,14}+y_{i,15}+y_{i,16}+y_{i,17}+y_{i,18}+y_{i,20} \\ y_{i,1}+y_{i,2}+y_{i,3}+y_{i,4}+y_{i,5}+y_{i,9}+y_{i,10}+y_{i,11}+y_{i,14}+y_{i,15}+y_{i,16}+y_{i,17}+y_{i,19} \\ y_{i,2}+y_{i,6}+y_{i,7}+y_{i,8}+y_{i,9}+y_{i,11}+y_{i,13}+y_{i,15}+y_{i,16}+y_{i,17}+y_{i,18}+y_{i,20} \\ y_{i,2}+y_{i,5}+y_{i,6}+y_{i,10}+y_{i,13}+y_{i,15}+y_{i,16} \\ y_{i,1}+y_{i,2}+y_{i,4}+y_{i,10}+y_{i,15}+y_{i,17} \\ y_{i,1}+y_{i,3}+y_{i,4}+y_{i,6}+y_{i,9}+y_{i,11}+y_{i,12}+y_{i,13}+y_{i,15}+y_{i,16}+y_{i,18}+y_{i,19}+y_{i,20} \\ y_{i,1}+y_{i,2}+y_{i,4}+y_{i,5}+y_{i,6}+y_{i,9}+y_{i,11}+y_{i,12}+y_{i,13}+y_{i,14}+y_{i,16}+y_{i,18}+y_{i,19} \\ y_{i,1}+y_{i,6}+y_{i,9}+y_{i,12}+y_{i,13}+y_{i,14}+y_{i,15}+y_{i,17}+y_{i,20} \end{bmatrix}
$$

FIG. 5

$$M_{yp} = \begin{bmatrix} 0 \\ 0 \\ 0 \\ SS_{p,1} \\ SS_{p,2} \\ \vdots \\ SS_{p,k} \end{bmatrix} = \begin{bmatrix} 1 & 0 & 0 & \cdots & 0 & 0 & 0 \\ 0 & 1 & 0 & \cdots & 0 & 0 & 0 \\ 0 & 0 & 1 & \cdots & 0 & 0 & 0 \\ \vdots & \vdots & \vdots & \ddots & \vdots & \vdots & \vdots \\ 0 & 0 & 0 & \cdots & 1 & 0 & 0 \\ 0 & 0 & 0 & \cdots & 0 & 1 & 0 \\ 0 & 0 & 0 & \cdots & 0 & 0 & 1 \end{bmatrix} \cdot \begin{bmatrix} 0 \\ 0 \\ 0 \\ SS_{p,1} \\ SS_{p,2} \\ \vdots \\ SS_{p,k} \end{bmatrix}$$

$$M_{IMS} = \begin{bmatrix} IMS_{p,1} \\ IMS_{p,2} \\ IMS_{p,3} \\ IMS_{p,4} \\ IMS_{p,5} \\ \vdots \\ IMS_{p,L} \end{bmatrix} = M'^{-1} \cdot M_{yp} = M'^{-1} \cdot \begin{bmatrix} 0 \\ \vdots \\ 0 \\ SS_{p,1} \\ SS_{p,2} \\ \vdots \\ SS_{p,k} \end{bmatrix}$$

616 — Pre-Encoding Operation List Generation Device

Input: $M'^{-1}$  Output: OL

FIG. 10

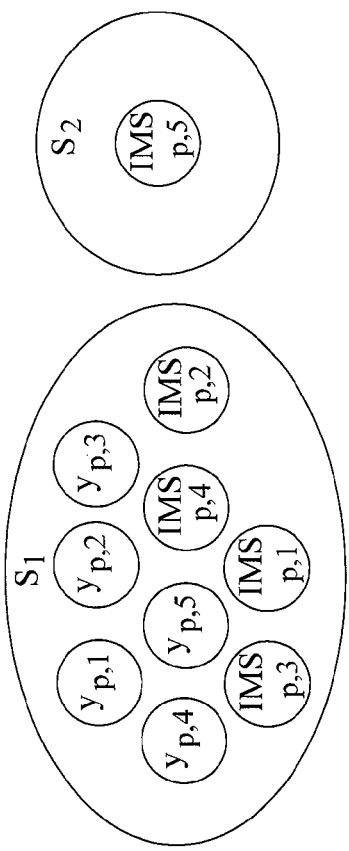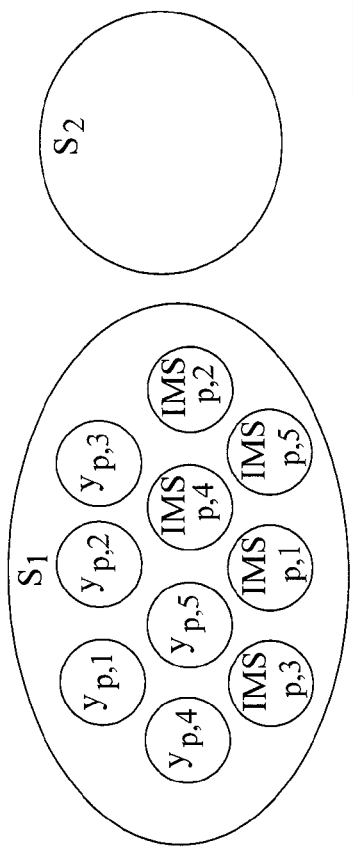

Since 3∈S[1][2], so S[1][3] is merged into S[1][2], and S[1][3] is cleared up; S[1][2] =S[1][2]∪S[1][3] = {2,3}, S [1][3] = {} — 1421

Since 3∈S [2][1] and 4∈S [2][1], so S [2][3] and S [2][4] are merged into S [2][1], and S [2][3] and S [2][4] are cleared up; S [2][1] =S [2][1]∪S[2][3]∪S[2][4]={1,3,4}, S [2][3]=S [2][4] = {} — 1422

Since 2∈S[3][1], S[3][2] is merged into S[3][1], and S[3][2] is cleared up; S[3][1] = S[3][1]∪S[3][2] = {1,2,4,5}, S [3][2] = {} — 1423

Since 5∈S[3][1], so S[3][5] is merged into S[3][1], and S[3][5] is cleared up; S[3][1] = S[3][1]∪S[3][5] = {1,2,3,4,5}, S[3][5] = {} — 1424

Since 3∈S [3][1] and 4∈S[3][1], so S[3][3] and S[3][4] are merged into S[3][1], and S[3][3] and S[3][4] are cleared up;S[3][1] = S[3][1]∪S[3][3]∪S[3][4] = {1,2,3,4,5}, S[3][3] = S[3][3] = {} — 1425

Since 5∈S[4][2], so S[4][5] is merged into S[4][2], and S[4][5] is cleared up;S[4][2]=S[4][2]∪S[4][5]={2,5}, S[4][5] = {} — 1426

Since 4∈S[4][3], so S[4][4] is merged into S[4][3], and S[4][4] is cleared up;S[4][3] = S[4][3]∪S[4][4] = {3,4}, [4][4] = {} — 1427

FIG. 14B

Members in S[2][1] have not yet been added to the OL are 1 and 4.
Since IMSp,1=IMSp,3⊕yp,2⊕yp,3 and IMSp,4=IMSp,1⊕yp,1⊕yp,4, two members [XOR (p,1){IMS(p,3), y(p,2), y(p,3)}] and [XOR(p,4){IMS(p,1), y(p,1), y(p,4)}] are concatenated at the end of the operation list OL.

OL=[Original (p,2) {}], [XOR (p,3) {IMS(p,2), y(p,1)}], [XOR(p,1) {IMS(p,3), y(p,2), y(p,3)}], [XOR (p,4) {IMS(p,1), y(p,1), y(p,4)}].

FIG. 14D

The member of S[3][1] has not yet been added into the OL is 5. Since
IMSp,5=IMSp,1⊕yp,3⊕yp,4⊕yp,5, so a member
[XOR (p) {IMS (p, 1), y, (p, 3), y (p, 4), y (p, 5)}]
is concatenated at the end of the operation list OL OL=[Original (p,2) {}], [XOR (p,3) {IMS(p,2), y(p,1)}], [XOR (p,1) {IMS(p,3), y(p,2), y(p,3)}], [XOR (p,4) {IMS(p,1), y(p,1), y(p,4)}], [XOR (p,5) {IMS(p,1), y(p,3), y(p,4), y(p,5)}].

FIG. 14E

APPARATUS AND METHOD FOR ACCELERATING THE ENCODING OF RAPTOR CODES

CROSS-REFERENCE TO RELATED APPLICATION

The present application is based on, and claims priority from, Taiwan Patent Application No. 101131875, filed Aug. 31, 2012, the disclosure of which is hereby incorporated by reference herein in its entirety.

TECHNICAL FIELD

The disclosure generally relates to apparatus and method for accelerating the encoding of Raptor codes.

BACKGROUND

The streaming media is a multimedia transmission method over a network. When a server receives a request of watching video/audio data from a client, the server decomposes the video/audio data into multiple small packets and sends each packet to the client; and then the applications on the client end reorganize these received packets to render the reconstructed video/audio data in real-time on the display device of the client site. Thus the endless supplying of the video/audio data flows from the server to the client site, and results in a continuous video/audio stream. This multimedia transmission method is usually called as streaming media.

For the client, the transmission method of streaming media may shorten the delay time of watching the selected video/audio data content. The client may easily determine whether the video/audio data content received for watching is preferred or not, without having to spend a lot of money and time to download useless data. Thus the client may easily watch the data content on-demand as using the home TV or the video recording device, and the data content received may be rewound fast forward or backward, to make viewing Internet video/audio more accessible. For a content provider, a well-designed method of streaming media only transmits data for rendering, without leaving any permanent copy at the client side. This may also ensure the rights of copyright holder.

With the popularization of broadband networks, the types of applications for wireless network become more and more numerous. During the network video/audio transmission and broadcasting, bit error or packet loss often occurs. In general, network video/audio transmission and broadcast technologies use forward error correction (FEC) codes to restore original data or to recover lost packet(s). In general, FEC codes may be deployed in the physical layer, in the media access control (MAC) layer, or in the application layer. In comparison to the FEC codes deployed in the other two-layers, the FEC of the application layer (abbreviated as AL-FEC) has the following features: the supported block length may be longer for providing better error correction capability; since its encode/decode efficiency is high, its implementation only requires software resources so that can be easily deployed on a variety of devices; different block lengths may be selected for different applications to provide flexible error correction capability; and capable of setting different protection parameters for different transmitted data and different packet loss rates.

The Raptor code or the RaptorQ code is one of the common application layer forward error correction (AL-FEC) codes. The request for comments (RFC) document published in the Internet Engineering Task Force (IETF) specifies the implementation details of the Raptor code or the RaptorQ code. As shown in FIG. 1, the Raptor code encoding is basically divided into two stages. The first stage is the pre-encoding operation 110, the second stage is using a common coding mode for encoding, such as the Luby Transform coding (LT coding) operation 120. Most of the time for implementing the Raptor code encoding is spent on the pre-encoding operation of the first stage. The pre-encoding operation pre-codes multiple input symbols, which mainly performs operations for solving simultaneous equations to produce intermediate symbols 130.

After the encoding operation through the complex pre-encoding stage and the LT coding, the Raptor code may produce a very simple output symbol distribution. A paper discloses an encoding algorithm for LT code. This algorithm encodes the input symbols, and each output symbol is the result of the exclusive OR (XOR) operation(s) of one or more input symbols. This encoding method only determines what proportion of the output symbols is formed by a specific number (degree) of the input symbol(s) that are randomly selected. Once the distribution of the specific degree satisfies a specific condition, if the number of the output symbols is slightly higher than the number of the input symbols, the input symbols may be entirely recovered with a high probability.

In the pre-encoding operation of the Raptor code or the RaptorQ code encoding, the Gaussian elimination operation is often used to solve the simultaneous equations. For example, a technical paper discloses a Raptor code decoding technology. This decoding technology uses operation steps of incremental Gaussian elimination to accelerate the Gaussian elimination operation process of single block decoding, to have better efficiency during performing the decoding operation. Besides, a paper discloses a Raptor encoding/decoding technology with modifying a construction method of a matrix A in the 3GPP standard to achieve better operation efficiency of the Gaussian elimination for a single block, wherein the matrix A is used to encode the intermediate symbols into encoded symbols, or decode the received encoded symbols into intermediate symbols.

Another decoding technique of the Raptor code is disclosed for the decoding failure condition where the received encoded symbols are insufficient at a receiver side. This technique continues the reception of encoded symbols even after decoding failure. After receiving enough new encoded symbols, this technique uses a new algorithm to continue the previous decoding progress without restarting the whole decoding operation, to prevent wasting the operations during decoding a single block. A paper discloses the application of decoding Raptor codes in a network coding environment, and adjusts the degree distribution of input symbols with a specific degree of the Raptor code. Thus, the Raptor code may obtain an optimized rate of successful decoding in the network coding environment; this decoding technique uses multiple senders to perform the encoding operation for the same block at the same time, and when each sender performs the decoding operation, there is no any optimized coordination between each other.

There are patent documents disclose encoding and decoding technologies. For example, a patent document discloses an encoding/decoding system architecture based on a chain reaction code. As shown in the system architecture 200 in FIG. 2, based on a series of non-systematic keys $I_0, I_1, \ldots$ and a series of systematic keys $C_0, C_1, \ldots$, a systematic encoder 210 encodes k input symbols IS(0), IS(1), ..., IS(K−1). The output after the encoding contains k original input symbols IS(0), IS(1), ..., IS(K−1), and the repair symbols, denoted by $B(I_0), B(I_1), B(I_2), \ldots$. However, this document does not disclose information about parallelized encoding operations.

A patent document discloses a processing technology of video data. As shown in FIG. 3, at the transmitter end this technology sends the same video source data 310 through several different queues $Q_1 \sim Qn$ to multiple different FEC operation units $FEC_1 \sim FECn$ for performing encoding. Each FEC operation unit uses different error recovery techniques, and then all outputs are merged and transmitted to a network 320. After data is received at the receiver end from the network 320, the data is sent to dedicate FEC decoding unit(s) for performing decoding according to the content of the packet(s).

In the Raptor code or the RaptorQ code encoding, if the time for pre-encoding may be shortened then the overall encoding performance of the Raptor code or the RaptorQ code will be dramatically enhanced. In the aforementioned encoding and decoding technologies, some technologies accelerate the operation process for decoding a single block, which may improve the efficiency of the decoding operation; some technologies use multiple senders at the same time for encoding the same block, but each sender does not coordinate with others for achieving optimized encoding operations; some technologies use parallelized operation units at the sender end of video source data, but the FEC types used in each unit are different. Hence, no parallelized acceleration mechanism is included. For the Raptor encoding operation, it may be observed that the encoding operations among multiple blocks still share a lot of common detailed operations. Therefore, how to dramatically reduce the time of the pre-encoding procedure to enhance the overall encoding throughput of the Raptor code is very important.

SUMMARY

The exemplary embodiments of the present disclosure may provide an apparatus and method for accelerating the encoding of Raptor codes.

One exemplary embodiment relates to an apparatus for accelerating the encoding of Raptor codes. The encoding accelerating apparatus may comprise a pre-encoding matrix generation device, a pre-coding operation list (OL) storage device, a pre-encoding OL generation device, and at least one prompt intermediate symbol generation device. The pre-encoding OL storage device stores at least one operation list, and each of the at least one operation list has a corresponding block length. The pre-coding matrix generation device is configured to generate an encoding matrix M corresponding to an inputted block length and compute an inverse matrix $M^{-1}$, or make the pre-coding operation list storage device output an operation list corresponding to the inputted block length; based on the encoding matrix M or the inverse matrix $M^{-1}$, the pre-encoding operation list generation device generates a new operation list (new OL). Based on one of the two operation lists and at least one inputted source symbol set, the at least one prompt intermediate symbol generation device generates at least one intermediate symbol set to provide to at least one fountain code encoder for encoding.

Another exemplary embodiment relates to a method for accelerating the encoding of Raptor codes. The method may comprise: configuring a pre-coding operation list storage device to store at least one operation list, and each of the at least one operation list having a corresponding block length; when an inputted block length is stored in the pre-coding operation list storage device, outputting a stored operation list corresponding to the inputted block length by the pre-coding operation list storage device; otherwise, generating a new operation list by using a pre-encoding operation list generation device after computing an encoding matrix M or an inverse matrix $M^{-1}$; and based on at least one inputted source symbol list and one of the two operation lists, generating at least one intermediate symbol set to provide to at least one fountain code encoder for encoding through at least one prompt intermediate symbol generation device.

The foregoing and other features of the exemplary embodiments will become better understood from a careful reading of detailed description provided herein below with appropriate reference to the accompanying drawings.

BRIEF DESCRIPTION OF THE DRAWINGS

FIG. 5 shows an exemplary schematic view illustrating an optimized operation list which is produced after a special design treatment, according to an exemplary embodiment.

FIG. 10 shows an exemplary schematic view of a pre-encoding operation list generation device, according to an exemplary embodiment.

FIG. 13A-FIG. 13F show each step and its operation result for generating the operation list in FIG. 11, according to an exemplary embodiment.

FIG. 14A-FIG. 14E show each step and its operation result for generating the operation list in FIG. 12, according to an exemplary embodiment.

DETAILED DESCRIPTION OF THE EXEMPLARY EMBODIMENTS

Figure 1:
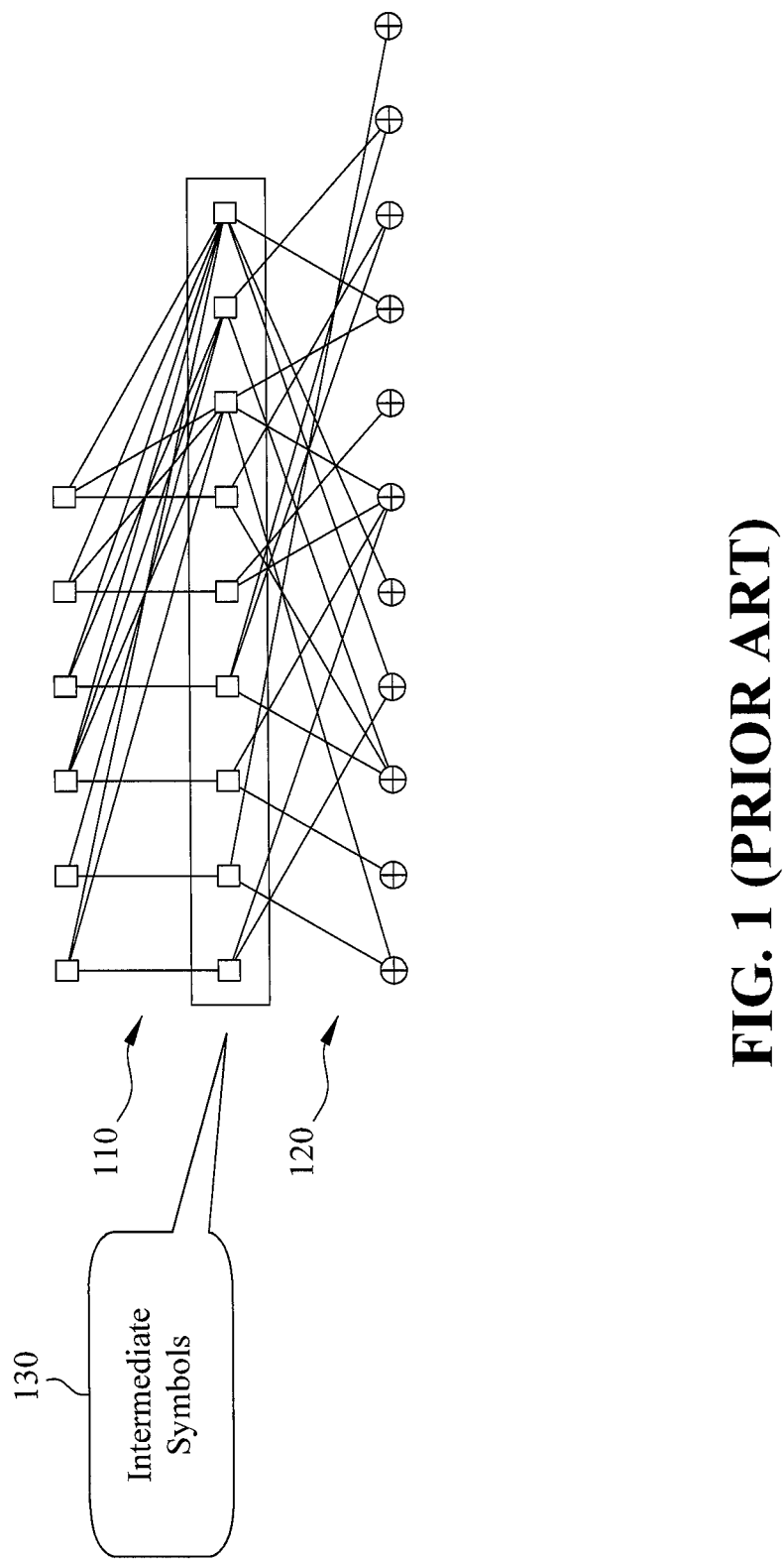
FIG. 1 shows an exemplary schematic view illustrating an encoding process of Raptor codes.
Figure 2:
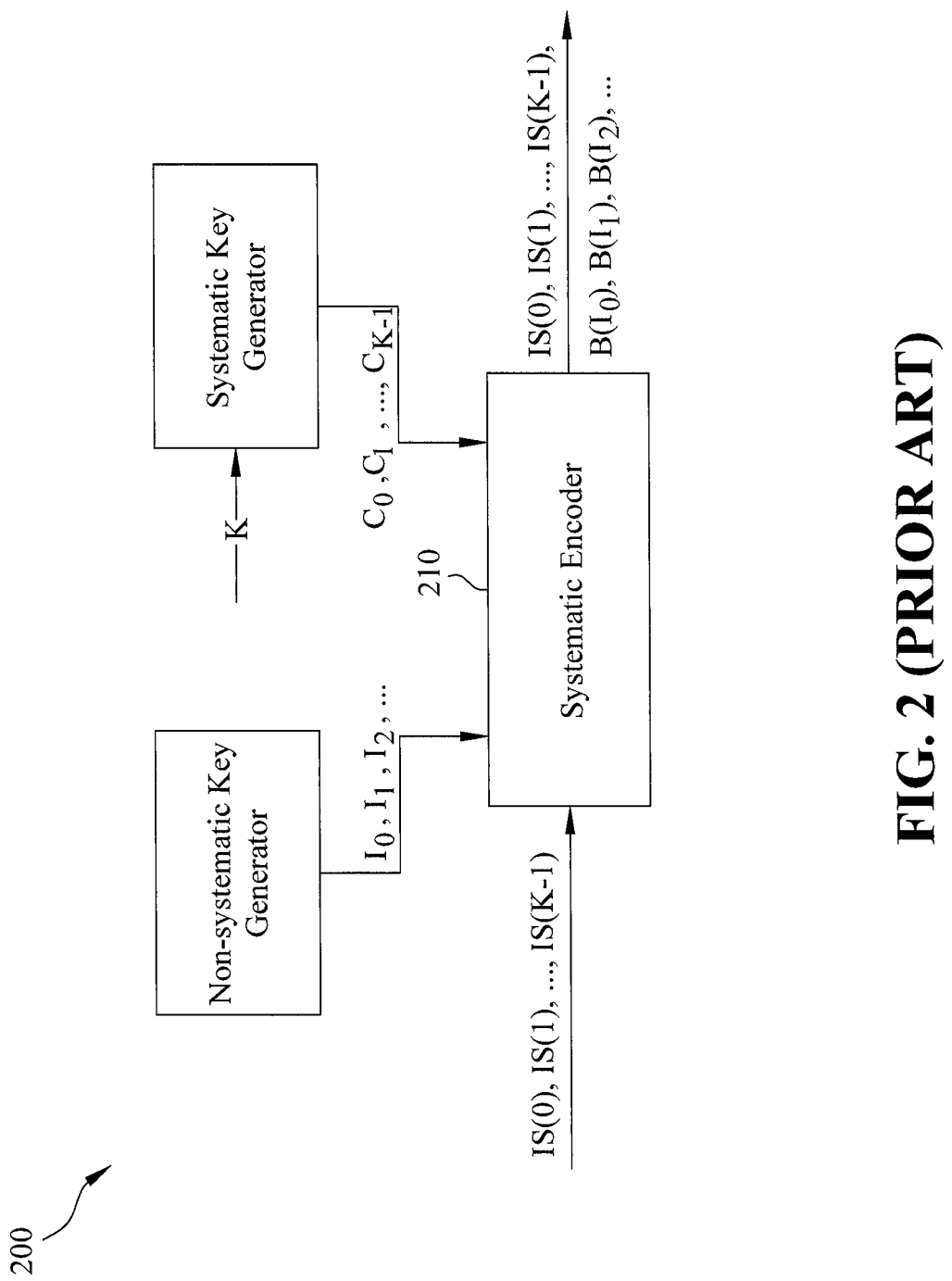
FIG. 2 shows an exemplary schematic view illustrating architecture of an encoding/decoding system based on chain reaction code.
Figure 3:
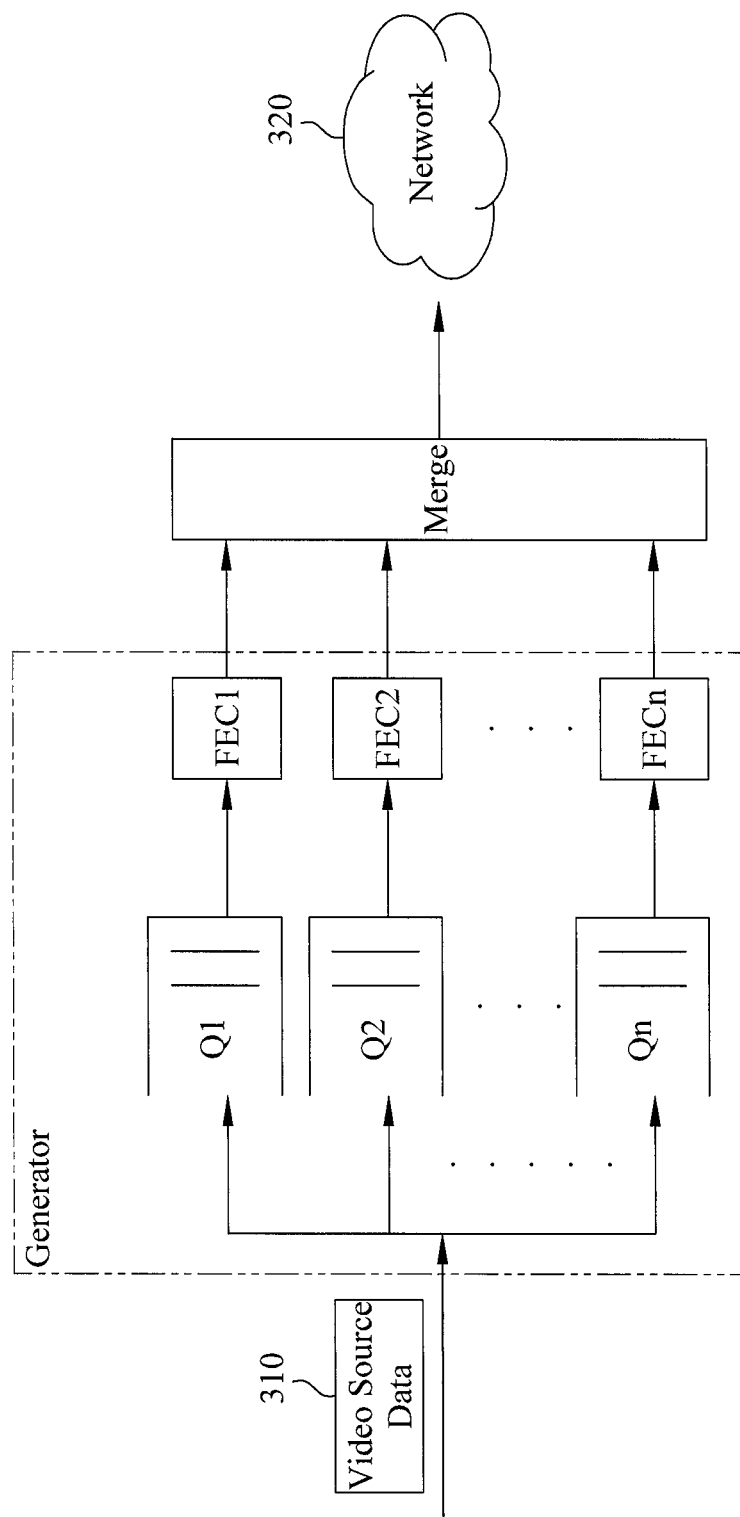
FIG. 3 shows an exemplary schematic view illustrating a processing technology of video data.

Below, exemplary embodiments will be described in detail with reference to accompanied drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

The pre-encoding of the Raptor code or the RaptorQ code mainly performs an operation of solving simultaneous equations to produce the intermediate symbols. The operation of solving simultaneous equations may be represented by a matrix equation. The following is illustrated by an exemplary matrix equation.

$$\begin{bmatrix} 1 & 0 & 1 & 0 & 0 & 0 & 0 & 0 & 0 & 0 & 0 & 0 \\ 1 & 1 & 0 & 1 & 0 & 0 & 0 & 0 & 0 & 0 & 0 & 0 \\ 1 & 1 & 0 & 0 & 1 & 0 & 0 & 0 & 0 & 0 & 0 & 0 \\ 0 & 1 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 1 & 1 & 0 & 1 & 1 & 0 & 0 & 1 & 0 & 0 & 0 & 0 \\ 1 & 0 & 1 & 1 & 0 & 1 & 0 & 0 & 1 & 0 & 0 & 0 \\ 1 & 1 & 1 & 0 & 0 & 0 & 1 & 0 & 0 & 1 & 0 & 0 \\ 0 & 1 & 1 & 1 & 1 & 1 & 0 & 0 & 0 & 0 & 1 & 0 \\ 0 & 0 & 0 & 0 & 1 & 1 & 1 & 0 & 0 & 0 & 0 & 1 \\ 0 & 0 & 0 & 0 & 1 & 0 & 0 & 0 & 1 & 0 & 0 & 0 \\ 0 & 0 & 0 & 0 & 0 & 1 & 0 & 0 & 1 & 0 & 0 & 1 \end{bmatrix} \cdot \begin{bmatrix} x_1 \\ x_2 \\ x_3 \\ x_4 \\ x_5 \\ x_6 \\ x_7 \\ x_8 \\ x_9 \\ x_{10} \\ x_{11} \\ x_{12} \end{bmatrix} = \begin{bmatrix} y_1 \\ y_2 \\ y_3 \\ y_4 \\ y_5 \\ y_6 \\ y_7 \\ y_8 \\ y_9 \\ y_{10} \\ y_{11} \\ y_{12} \end{bmatrix}$$

wherein symbols $y_1 \ldots y_{12}$ represent derived input symbols derived from the source data, the values of $y_1 \ldots y_{10}$, are all 0, $y_{11}$ and $y_{12}$ are the source symbols $SS_0$ and the $SS_1$. In other words, in the example, the block length k of the source block formed by the source data is 2. This source block contains only two source symbols, $SS_0$ and $SS_1$. The matrix on the left of the equation is the encoding matrix generated during the encoding of the Raptor code or the RaptorQ code. The symbols $x_1 \ldots x_{12}$ are the unknown intermediate symbols. In other words, solving the intermediate symbols $x_1 \ldots x_{12}$ may be represented by a relationship $X=M^{-1}\cdot Y$ shown in the following.

$$\begin{bmatrix} x_1 \\ x_2 \\ x_3 \\ x_4 \\ x_5 \\ x_6 \\ x_7 \\ x_8 \\ x_9 \\ x_{10} \\ x_{11} \\ x_{12} \end{bmatrix} = \begin{bmatrix} 1 & 0 & 1 & 0 & 0 & 0 & 0 & 0 & 0 & 0 & 0 & 0 \\ 1 & 1 & 0 & 1 & 0 & 0 & 0 & 0 & 0 & 0 & 0 & 0 \\ 1 & 1 & 0 & 0 & 1 & 0 & 0 & 0 & 0 & 0 & 0 & 0 \\ 0 & 1 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 \\ 1 & 1 & 0 & 1 & 1 & 0 & 0 & 1 & 0 & 0 & 0 & 0 \\ 1 & 0 & 1 & 1 & 0 & 1 & 0 & 0 & 1 & 0 & 0 & 0 \\ 1 & 1 & 1 & 0 & 0 & 0 & 1 & 0 & 0 & 1 & 0 & 0 \\ 0 & 1 & 1 & 1 & 1 & 1 & 0 & 0 & 0 & 0 & 1 & 0 \\ 0 & 0 & 0 & 0 & 1 & 1 & 1 & 0 & 0 & 0 & 0 & 1 \\ 0 & 0 & 0 & 0 & 1 & 0 & 0 & 0 & 1 & 0 & 0 & 0 \\ 0 & 0 & 0 & 0 & 0 & 1 & 0 & 0 & 1 & 0 & 0 & 1 \end{bmatrix}^{-1} \cdot \begin{bmatrix} y_1 \\ y_2 \\ y_3 \\ y_4 \\ y_5 \\ y_6 \\ y_7 \\ y_8 \\ y_9 \\ y_{10} \\ y_{11} \\ y_{12} \end{bmatrix}$$

In other words, when the column vector Y represents the derived input symbols derived from the source data, the column vector X represents the intermediate symbols to be solved, and the matrix M represents the generated encoding matrix during the encoding of the Raptor code or the RaptorQ code, then the relationship $X=M^{-1}\cdot Y$ is established. Wherein, the rule for deriving the column vector Y from k sources symbols of the source data is defined in the standards of the Raptor code or the RaptorQ code, i.e., RFC-5053 and RFC-6330.

Figure 4:
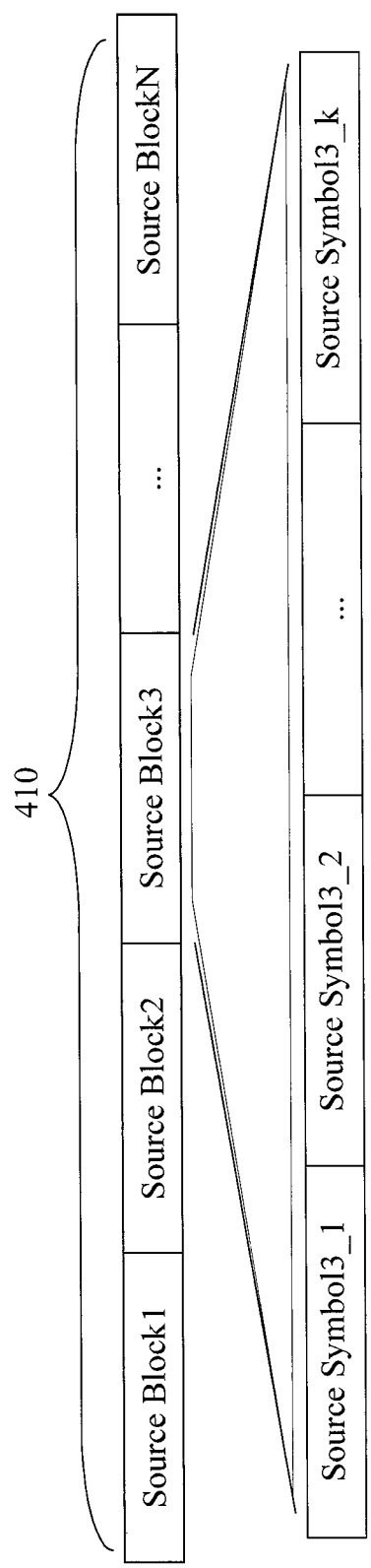
FIG. 4 shows an exemplary schematic view illustrating the definition of a block length of a source block in the streaming delivery scenario, according to an exemplary embodiment.

Under a streaming delivery scenario, a source media stream 400 is divided into a number of source blocks. Each source block has one or more symbols, and the number of source symbols in each source block is defined as the block length of the source block. For example, in FIG. 4, a source media stream is divided into N source blocks, the source block 3 contains k source symbols, denoted by the source symbol 3_1 to the source symbol 3_k, therefore the block length of the source block 3 is k. During the encoding of the Raptor code or the RaptorQ code, when the block length of the used source blocks is the same, the generated encoding matrix M for the used source blocks is the same. In other words, the encoding matrix M only relates to the number of source symbols in the source block.

In the first stage (i.e., the pre-encoding stage) for the encoding of the Raptor code or RaptorQ code, the encoding matrix M may be predefined. For example, in the implemented standard RFC 5053 of the Raptor code, for a given block length of a source block to be encoded, a corresponding encoding matrix can be obtained. Similarly, in the implement standard RFC-6330 of the RaptorQ code, the encoding matrix M may be also pre-defined. In the encoding steps of the Raptor code or the RaptorQ code, the resulting encoding matrixes are the same for the source blocks to be encoded with the same block length, independent of the contents of the input data. Therefore in implementing the encoding of the Raptor code or the RaptorQ code, when the source data to be encoded have the same block length, there exits a large number of repeated operations during the pre-encoding.

For example, during the pre-encoding stage for generating the inverse matrix $M^{-1}$ of the encoding matrix M, a large number of repeated operations of the Gaussian elimination method are performed. Since the most time-consuming part of the entire operation of the Gaussian elimination method is searching which row (the $R_1$-th row) in the M matrix having the lowest weight, and searching which rows (the Ri-th row) in the M matrix having C-th column with value of 1. In these two steps, the input symbols are not involved in the operation but only the matrix M is required. Since the generation of matrix M only relates to the block length, and the block length does not change often, therefore, these two steps almost always repeat the same operation even the input symbols contain different data.

Usually the encoding matrix M is a matrix of a large order. For example, on the platform of performing WiFi multicast streaming inside a high-speed rail train (HSRT), the block length of a source block is fixed to 4 MB, i.e., 4096 source symbols of 1 KB size. In other words, when performing multicast streaming for the source data, the number of symbols contained in each source block equals to 4096, i.e. k=4096. In this example, both the order of the encoding matrix M and the order of the inverse matrix $M^{-1}$ are 4248× 4248. Therefore, to solve intermediate symbols X (equal to $M^{-1}\cdot Y$) will take lots of computations.

The pre-encoding stage of the Raptor code or the RaptorQ code takes most of the time on the operation of the Gaussian elimination method. The disclosed exemplary embodiments perform the Gaussian elimination method only once to replace the aforementioned repeated execution of the Gaussian elimination method. By recording the required time and the data generation rate for encoding, it may find out that the encoding throughput may be increased to more than double of the original value according to the estimated encoding throughput statistics, such as the maximum throughput and the incremental value of throughput. Furthermore, the greater the block length, the larger the incremental value of throughput.

Therefore, in the Raptor code or the RaptorQ code encoding, the disclosed exemplary embodiments adjust the architecture of the pre-encoding operation by pre-completing the operations of the Gaussian elimination method with the same block length, and introduce the use of an operation list to further generate an optimized operation list. The content of the operation list is an execution order of the XOR operation required for the pre-encoding operations. When a source block with the same number of symbols is encountered during processing the source data in the pre-encoding stage, the disclosed exemplary embodiments directly uses the previously generated operation list to replace the time-consuming operations of the original inverse matrix $M^{-1}$ multiplied by the derived input symbols Y, thereby saving the computing resources of the processor.

In the process of generating intermediate symbols, there are a lot of operations may be omitted for the multiplication of the inverse matrix $M^{-1}$ and the derived input symbol Y. The matrix multiplication may be optimized through the data dependencies when the multiplication is performed, to reduce the required XOR operations of the matrix multiplication operation. In one exemplar shown in FIG. 5, the inverse matrix $M^{-1}$ is a 20×20 matrix, the matrix at the right side of the equation is formed by the intermediate symbols, and the multiplication of the inverse matrix $M^{-1}$ and the derived input symbols Y is a complex process. As shown in FIG. 5, the generation process of an intermediate symbol may be simplified by the generation through XOR operation (i.e., "+" operation in FIG. 5) of one or more input derived symbols. Further, each row in the matrix formed by the generation of the intermediate symbol X may be generated through the XOR operation(s) of other row(s) and the derived input symbol(s) Y, or through the XOR operation(s) of derived input symbol(s) Y, or through the XOR operation(s) of the intermediate value(s) that are generated while calculating other row (s) and the derived input symbol(s) Y. For example, let $Z=Y_{i,1}+Y_{i,2}+Y_{i,3}+Y_{i,4}+Y_{i,9}+Y_{i,10}$ is an intermediate value for calculating $X_{i,1}$, then $X_{i,2}$ may be obtained by an operation of $Z+Y_{i,5}+Y_{i,6}+Y_{i,15}+Y_{i,16}+Y_{i,17}+Y_{i,20}$. Therefore, in large-order matrix operations, the optimized operation list (OL) may be generated after a special design, so that a simplified matrix operation may be achieved. The disclosed exemplary embodiment uses a pre-encoding operation list generation device to achieve the optimized design for the operation list, and to accelerate the encoding speed of the Raptor code and the RaptorQ code.

Figure 6A:
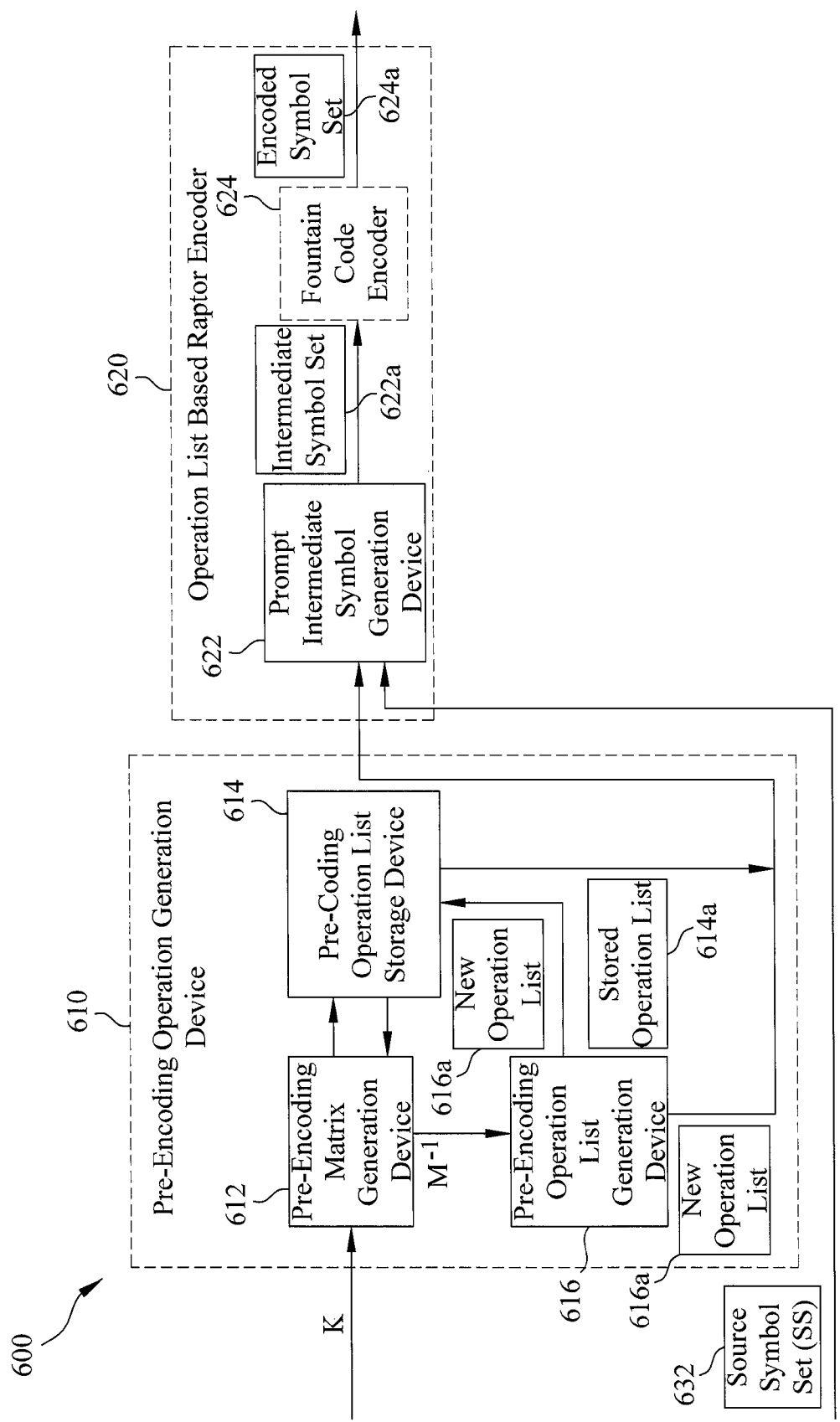
FIG. 6A shows an apparatus for accelerating the encoding of Raptor codes, according to an exemplary embodiment.

FIG. 6A shows an apparatus for accelerating the encoding of Raptor codes, according to an exemplary embodiment. The encoding accelerating apparatus may be adapted to the Raptor code encoding, also adapted to the RaptorQ code encoding. As shown in FIG. 6A, the encoding accelerating apparatus 600 may comprise a pre-encoding operation generation device 610, and at least one prompt intermediate symbol generation device 622. The pre-encoding operation generation device 610 includes a pre-encoding matrix generation device 612, a pre-coding operation list storage device 614, and a pre-encoding operation list generation device 616. The operation list based Raptor encoder 620 includes at least one prompt intermediate symbol generation device 622. The pre-coding operation list storage device 614 stores at least one operation list, and at least one block length corresponding to each of the at least one operation list, respectively.

The pre-encoding matrix generation device 612 is configured to generate an encoding matrix M corresponding to an inputted block length k and compute an inverse matrix $M^{-1}$, or make the pre-coding operation list storage device 614 output an operation list corresponding to the inputted block length. For example, the pre-encoding matrix generation device 612 may make a pre-coding operation list storage device 614 output an stored operation list (stored OL) 614a corresponding to the inputted block length to the prompt intermediate symbol generation device 622; or according to the block length k to generate a coding matrix M, and compute an inverse matrix $M^{-1}$ and output to the pre-encoding operation list generation device 616. The pre-encoding operation list generation device 616, based on the inverse matrix $M^{-1}$, generates a new operation list 616a to provide to the prompt intermediate generation device 622, and stores the new operation list 616a and the block length k to the pre-coding operation list storage device 614. The content of each operation list stored in the pre-coding operation list storage device 614 is the execution order of required XOR operation(s) for performing a pre-encoding operation.

The prompt intermediate symbol generation device 622, in accordance with a received operation list and at least one inputted source symbol sequence 632, generates at least one intermediate symbol set 622a to provide to at least one fountain code encoder 624 for encoding, to generate at least one encoded symbol set 624a. The received operation list is one of the new operation list 616a and the stored operation list 614a. The fountain code encoder 624 is such as a Luby Transform (LT) encoder.

According to another exemplary embodiment, the encoding accelerator device 600 may comprise the pre-coding operation generation device 610, and an operational list based Raptor encoder (OL-based Raptor encoder) 620. The operational list based Raptor encoder 620 includes the prompt intermediate symbol generation devices 622 and the at least a fountain code encoder 624. Based on the inputted source symbol set 632 and an operation list generated by the pre-encoding operation generation device 610. The at least a fountain code encoder 624 generates at least one encoded symbol set 624a after performs encoding of an intermediate symbol set 622a generated by the prompt intermediate symbol generation device 622.

Figure 6B:
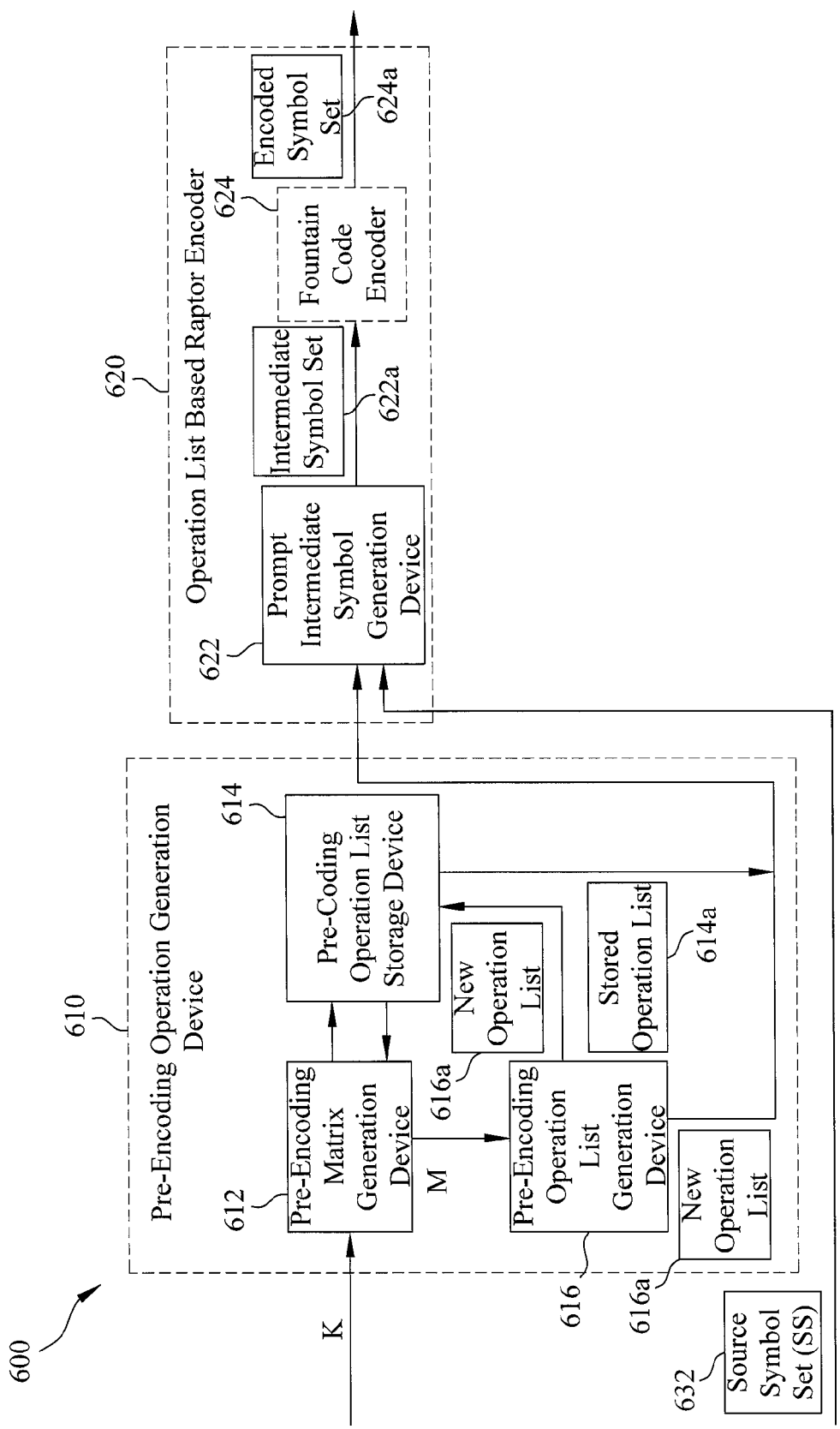
FIG. 6B shows another method that the pre-encoding operation list generation device generates a new operation list, according to an exemplary embodiment.

The pre-encoding operation list generation device 616 may use different ways to generate new operation list 616a. FIG. 6B shows another method that the pre-encoding operation list generation device generates a new operation list in another scheme, according to an exemplary embodiment. The difference between FIG. 6B and FIG. 6A is that the pre-encoding operation list generation device 616 in FIG. 6B may receive the encoding matrix M generated by the pre-encoding matrix generation device 612 and executes an operation of the Gaussian elimination method at an encoding stage of Raptor code, and generates a new operation list when the operation of the Gaussian elimination method is finished. In other words, according to exemplary embodiments of FIG. 6A and FIG. 6B, the pre-encoding operation list generation device in the encoding accelerator device 600 may generate a new operation list according to the encoding matrix M or its inverse matrix $M^{-1}$.

In the exemplary embodiment of FIG. 6B, during the operation of the Gaussian elimination method, the pre-encoding operation generation device 616, through recording a flow order of a series of at least one XOR operation and at least one permutation operation performed for the row(s) of the encoding matrix M, generates the new operation list when the operation of the Gaussian elimination method is finished. Since in the operation process of the above-mentioned Gaussian elimination method, the XOR operations may be performed before the permutation operations, thus the series of XOR operations and permutation operations mentioned above may be a series of XOR operations in addition of a series of permutation operations.

Figure 7:
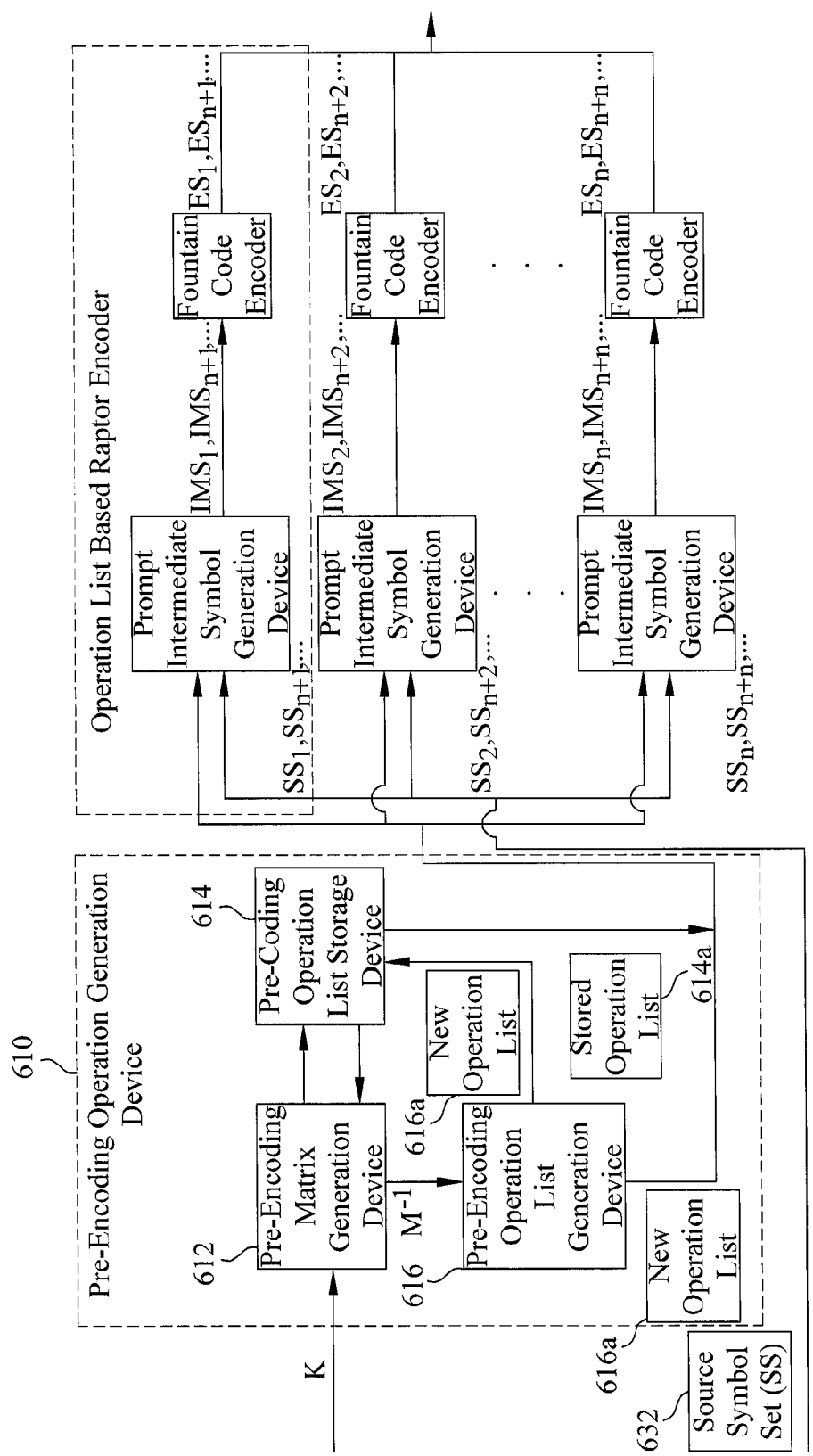
FIG. 7 shows a parallelized architecture for implementing the apparatus for accelerating the encoding of Raptor codes in FIG. 6, according to an exemplary embodiment.

In the architecture of encoding accelerating apparatus in FIG. 6A and FIG. 6B, a series of source symbol sets may be arranged into parallel inputs, and coupled with the parallelized prompt intermediate symbol generation device 622 and the parallelized fountain code encoder 624, to perform encoding of the Raptor code or the RaptorQ code. So that the encoding of the Raptor code and the RaptorQ code may achieve parallelized also optimized operation and accelerate its encoding process. FIG. 7 shows parallelized architecture for implementing the apparatus for accelerating the encoding of Raptor codes in FIG. 6A, according to an exemplary embodiment.

As shown in FIG. 7, the operation list generated by the pre-encoding operation generation device 610 is provided with a parallelized way to the first to the n-th prompt intermediate symbol generation devices for performing operations. In all source symbols (i.e., the source symbol lists $SS_j$, $SS_{n+j}$, . . . and j=1, n) in a series of source symbol sets SS, these lists $SS_j$, $SS_{n+j}$, . . . parallel input to each j-th prompt intermediate symbol generation device to generate respective j-th intermediate symbol list $IMS_j$, $IMS_{n+j}$, . . . , and output to the respective j-the fountain code encoder, wherein j equals 1 to n. In other words, the n source symbol lists $SS_1$, $SS_{n+1}$, . . . ~$SS_n$, $SS_{n+n}$, . . . input in parallel to the first to the n-th prompt intermediate symbol generation devices to produce in parallel n intermediate symbol lists $IMS_1$, $IMS_{n+1}$, . . . ~$IMS_n$, $IMS_{n+n}$, . . . , and then output in parallel to the first to the n-th fountain code encoders to produce in parallel n encoded symbol lists $ES_1$, $ES_{n+1}$, . . . ~$ES_n$, $ES_{n+n}$, . . . .

Accordingly, the encoding accelerating apparatus shown in FIG. 7 is implemented by a parallelized hardware architecture, wherein the at least a prompt intermediate symbol generation device 622 is multiple prompt intermediate symbol generation devices, and the at least a fountain code encoder 624 is multiple fountain code encoders. This encoding accelerating apparatus arranges a series of source symbol sets to input in parallel the multiple prompt intermediate symbol generation devices, produce in parallel multiple intermediate symbol lists, and output in parallel to the multiple fountain code encoders for encoding. Similarly, this encoding accelerating apparatus may also include pre-coding generation device 610 and an operation list based Raptor code or RaptorQ code encoder formed by the multiple prompt intermediate symbol generation devices and the multiple fountain code encoders. This operation list based Raptor code encoder produces an operation list, according to a series of inputted source symbol sets and pre-encoding operation generation device 610; and after performs encoding for this multiple intermediate symbol sets generated in parallel from the multiple prompt intermediate symbol generation devices via the multiple fountain code encoders, outputs in parallel multiple encoded symbol sets.

Figure 8:
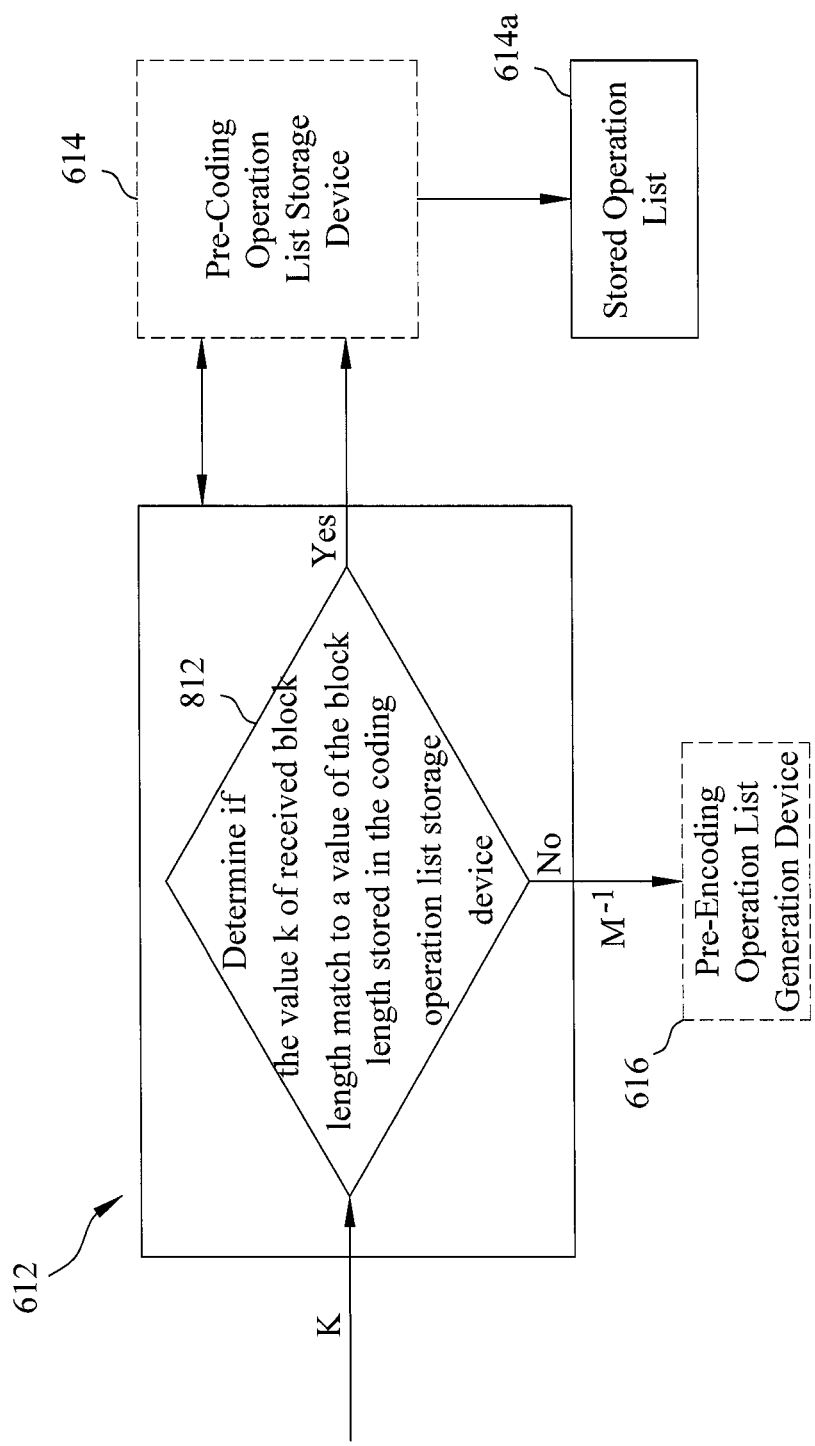
FIG. 8 shows an exemplary operation flow of a pre-encoding matrix generation device, according to an exemplary embodiment.

FIG. 8 shows an exemplary operation flow of a pre-encoding matrix generation device, according to an exemplary embodiment. As shown in FIG. 8, the pre-coding matrix generation device 612 determines if the value k of a current block length received matches to a value of block length stored in the pre-coding operation list storage device 614, by inquiring the pre-coding operation list storage device 614, as shown in label 812. In other words, when there already exists the block length k in the current encoding operation list storage device 614, the pre-encoding matrix generation device 612 makes the pre-coding operation list storage device 614 output directly the operation list 614a corresponding to this block length; when there is no such a block length k, then reproduces the matrix M according to the received value k and related parameters, and calculates its inverse matrix $M^{-1}$ and outputs $M^{-1}$ to the pre-encoding operation list generation device 616.

Figure 9:
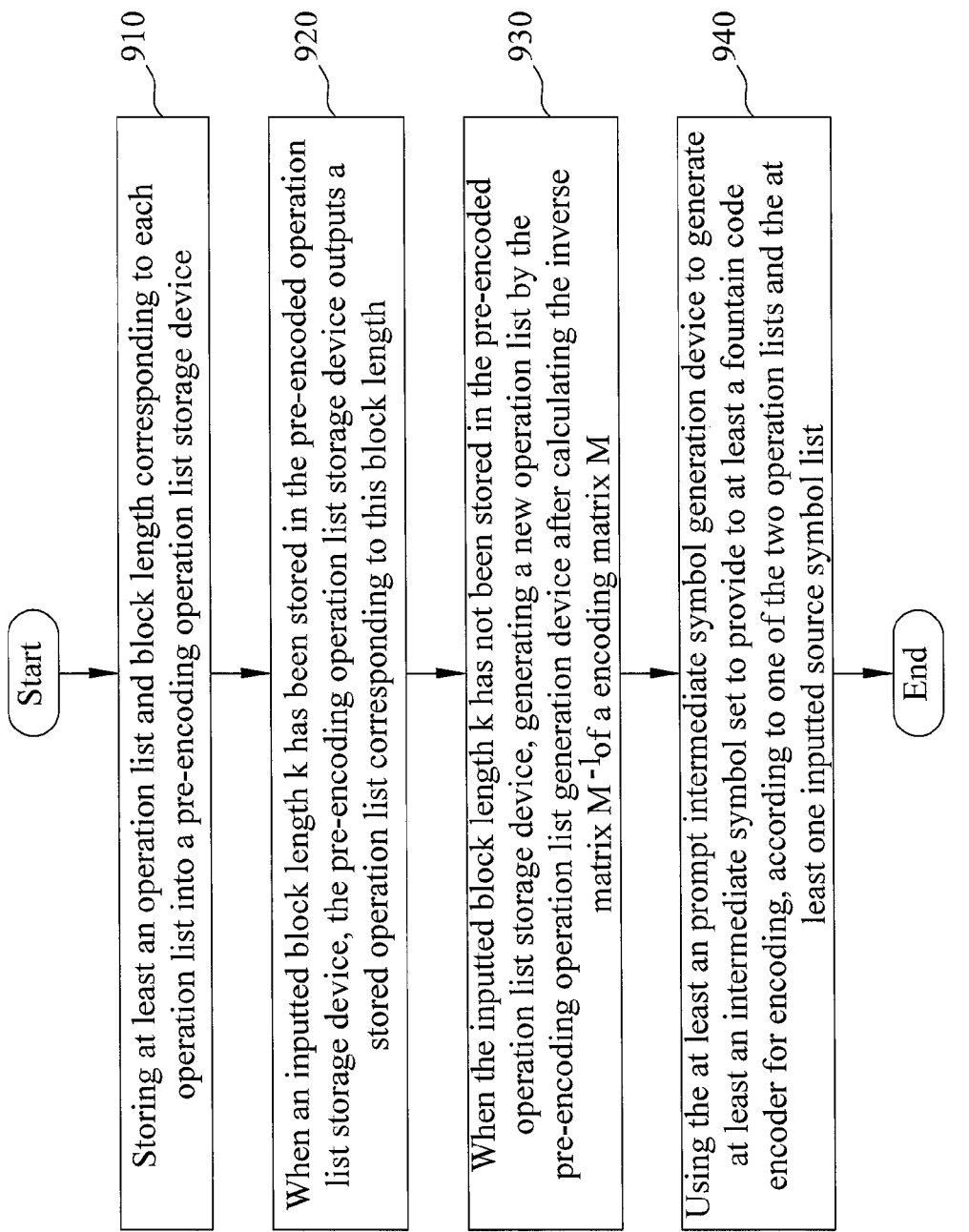
FIG. 9 shows a method for accelerating the encoding of Raptor codes, according to an exemplary embodiment.

Accordingly, FIG. 9 shows a method for accelerating the encoding of Raptor codes, according to an exemplary embodiment. As shown in FIG. 9, the encoding accelerating method stores at least one operation list and the block length corresponding to each operation list into a pre-coding operation list storage device, as shown in step 910; when an inputted block length k has been stored in the pre-encoded operation list storage device, the pre-coding operation list storage device outputs a stored operation list corresponding to this block length, as shown in step 920; when inputted block length k has not been stored in the pre-encoded operation list storage device, after calculates the encoding matrix M or its inverse matrix $M^{-1}$, the pre-encoding operation list generation device generates a new operation list, as shown in step 930; then uses at least one prompt intermediate symbol generation device, according to one of the two operation lists and the at least one inputted source symbol list to generate at least one intermediate symbol set to provide to at least one fountain code encoder for encoding, as shown in step 940. The block length k and the new operations list are stored into the pre-coding operation list storage device.

The encoding accelerating method, as aforementioned, may use the pre-encoding operation list generation device to generate a new operation list according to the inverse matrix $M^{-1}$. Another method to generate a new operation list is based on the encoding matrix M. That is, the pre-encoding operation list generation device executes an operation of the Gaussian elimination method at an encoding stage of Raptor code, and generates the new operation list when the operation of the Gaussian elimination method is finished. During the operation process of the Gaussian elimination method, through recording a flow order of a series of at least one XOR operation and at least one permutation operation performed for the row(s) of the encoding matrix M, the method generates the new operation list when the operation of the Gaussian elimination method is finished. The aforementioned flow order of a series of XOR operation(s) and permutation operation(s) may be a flow order of a series of XOR operations in addition to a series of permutation operations.

This encoding accelerating method mentioned above may also use a parallelized way to provide the operation list generated by the pre-encoding operation list generation device simultaneously to the multiple prompt intermediate symbol generation devices for performing operations; also this encoding accelerating method may arrange a series of the source symbol sets to input in parallel to the multiple prompt intermediate symbol generation devices, to generate in parallel multiple intermediate symbol lists, and to output in parallel to multiple fountain code encoders for encoding.

As aforementioned, the multiplication of the inverse matrix $M^{-1}$ and the derived input symbol Y is a complex process. Therefore, the disclosed exemplary embodiments of the encoding accelerating technique complete the operations of the Gaussian elimination method of for same source block length k in advance, and generates the optimized operation list by using a pre-encoding operation list generation device, the content of which is the execution order of XOR operations required for performing the pre-encoding operation. When the pre-encoding operation is required for following source blocks with same block length k, the previously generated operation list is used to replace the original process of $M^{-1}$ multiplied by the derivative input symbol Y. FIG. 10 shows an exemplary schematic view of a pre-encoding operation list generation device, according to an exemplary embodiment.

Figure 11:
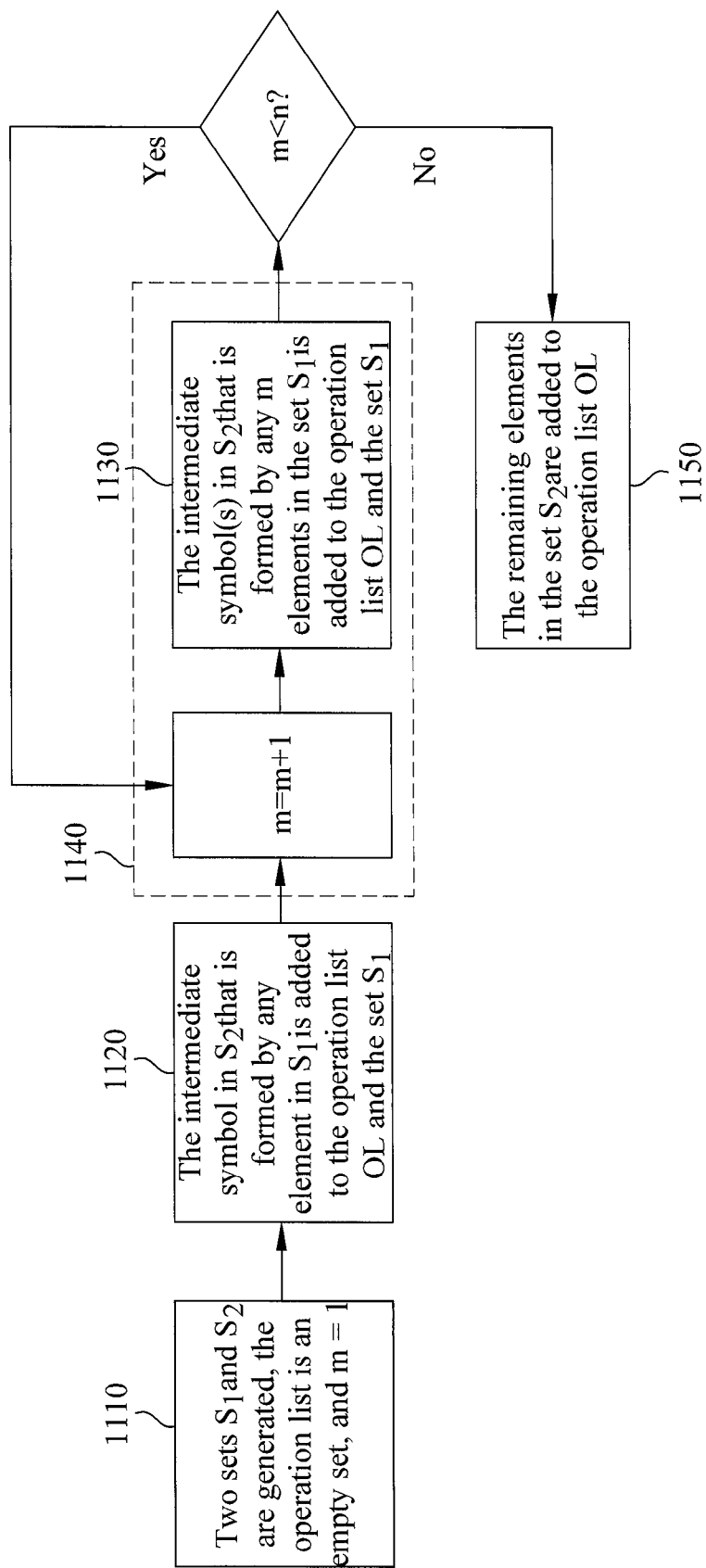
FIG. 11 shows an exemplary flow chart for generating an operation list, according to an exemplary embodiment.
Figure 12:
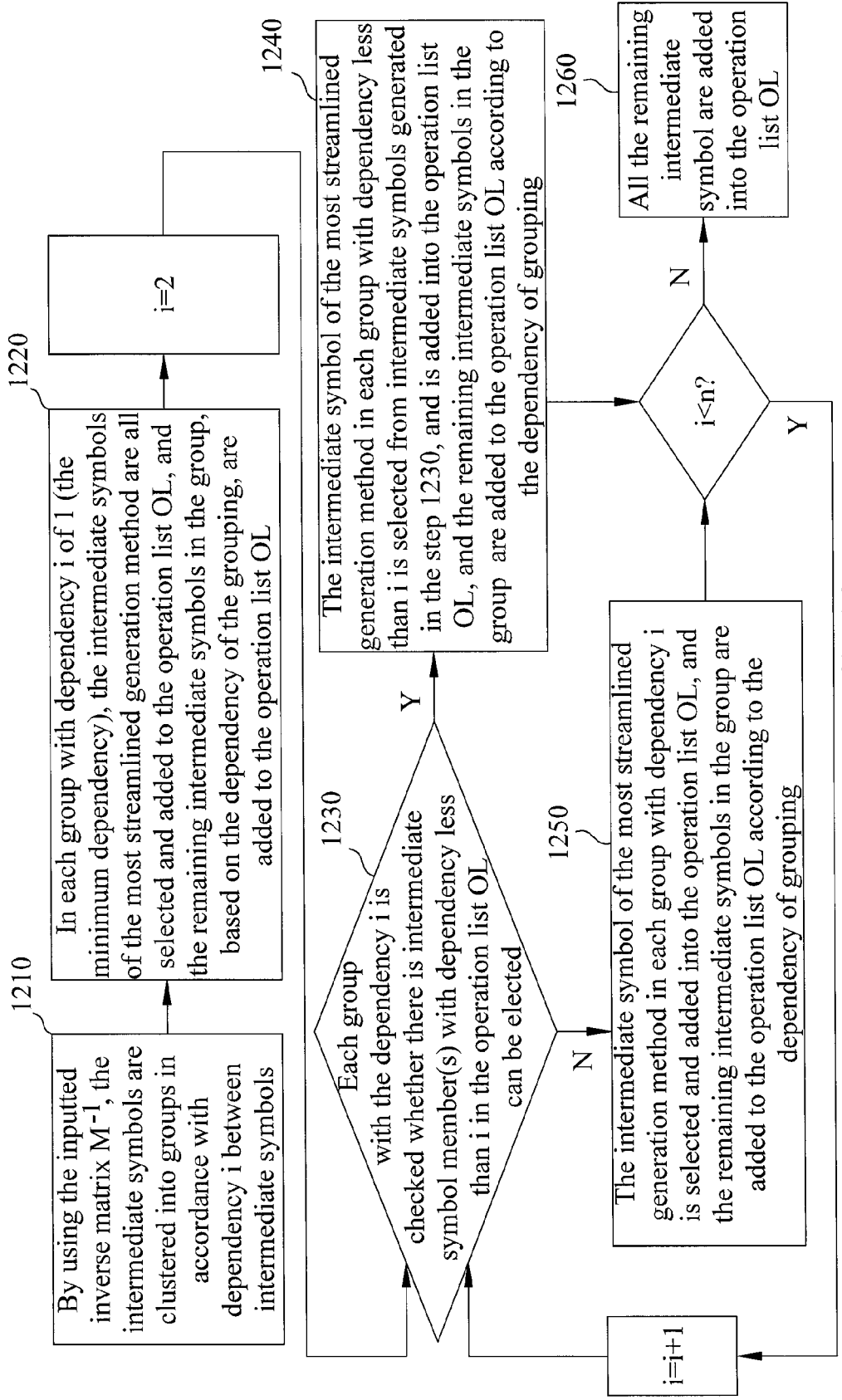
FIG. 12 shows an exemplary flow chart for generating an operation list, according to another exemplary embodiment.

FIG. 11 and FIG. 12 respectively illustrate two exemplary flow charts for generating an optimized operation list, but are not limited to these exemplary embodiments.

As shown in FIG. 10, based on the inputted inverse matrix $M^{-1}$, the pre-encoding operation list generation device generates an operation list (OL), wherein p is a positive integer, a source symbol set p is represented by $SS_p$, an intermediate symbol set p is represented by $IMS_p$, elements of the source symbol set p are k source symbols (i.e., $SS_{p,1}$, $SS_{p,2}$, $SS_{p,k}$), elements of the intermediate symbol set p are L intermediate symbols (i.e., $IMS_{P,1}$, $IMS_{P,2}$, ..., $IMS_{P,L}$). A derived input symbol set p is represented by $Y_p$, elements of derivative input symbol set p are L derived input symbols (that is, $Y_{P,1}$, $Y_{P,2}$, ..., $Y_{P,L}$), wherein L-k derives input symbols of $Y_{P,1}$ to $Y_{P,L-k}$ are all 0, k derived input symbols of $Y_{P,L-k+1}$ to $Y_{P,L}$ are $SS_{p,1}$, $SS_{p,2}$, $SS_{p,k}$. As shown in FIG. 10, the intermediate symbol in the intermediate symbol set p and the derived input symbol in the derived input symbol set p is represented by a relationship $IMS_p = M^{-1} \times Y_p$.

As mentioned before, the contents of each operation list is the execution order of required XOR operations for performing pre-encoding operation. The following illustrates the data structure of an operation list and the flow chart of generating the optimized operation list, according to an exemplary embodiment. The data structure of an operation list is formed by a series of members and each member has three fields including an operator, a target, and an empty set or a set of at least one source set, i.e., OL=[operator target empty set or {one or more source sets}], [operator target empty set or {one or more source sets}], and so on. When the pre-encoding operation is executed, operations are executed in accordance with the order of members inside an operation list. Each member of an operation list OL is a one-dimensional array, respectively labels each intermediate symbol on how to calculate the intermediate symbol.

There are two options of the required operations for the prompt intermediate symbol generation device 622 to generate intermediate symbols in at least an intermediate symbol set. One option is the XOR operation, while another option is the original operation. When the XOR operation is selected, the desired value is obtained by executing an XOR operation on all symbols represented in the following {source set}. When the original operation is selected, {source set} is an empty set at this time, the desired result is obtained by the matrix multiplication of the corresponding row vectors in the original inverse matrix $M^{-1}$ and the matrix formed by the derived source symbol set. The target is the assigned numbers of the intermediate symbols to be solved, and the range of the target is from 0 to L-1, or from 1 to L. The {source set} is the required source data set when the option of XOR operation is selected. The content of this set may be the assigned number(s) of the derived source symbol(s), or the assigned number(s) of the intermediate symbol(s) already obtained. The following uses an operation list as an exemplary embodiment for illustrating how this operation list performs the execution order of XOR operation according to the operation list.

For example, the operation list OL=[XOR 19 {Y(2), Y(8)}], [XOR 9 {IMS (19), Y(22)}], [XOR 517 {IMS(9), Y(551), Y(792)}], [XOR 457 {IMS(19), IMS(517), Y(84), Y(347)}], .... According to this operation list OL, in step 1, the [XOR 19 {Y(2), Y(8)}] represents that the 19-th intermediate symbol is obtained by the calculated value of performing an XOR operation on the second derived input symbol and the 8-th derived input symbol; in step 2, [XOR 9 {IMS (19), Y(22)}] represents that the 9-th intermediate symbol is obtained by the calculated value of performing an XOR operation on the 19-th intermediate symbol (which was calculated in step 1) and the 22-th derived input symbol; in step 3, [XOR 517 {IMS(9), Y(551), Y(792)}] represents that the 517-th intermediate symbol is obtained by the calculated value of performing an XOR operation on the 9-th intermediate symbol (which was calculated in step 2), the 551-th derived input symbol, and the 792-th derived input symbol; in step 4, [XOR 457 {IMS(19), IMS(517), Y(84), Y(347)}] represents that the 457-th intermediate symbol is obtained by the calculated value of performing an XOR operation on the 19-th intermediate symbol (which was calculated in step 1), the 517-th intermediate symbol (which was calculated in step 3), the 84-th derived input symbol, and the 347-th derived input symbol; and similarly, in step 5, it performs an XOR operation or an original operation for the next element [operator target {one or more source set}] . . . etc.

FIG. 11 shows an exemplary flow chart for generating an operation list, according to an exemplary embodiment, wherein the search range is a predetermined positive integer n. The size of n relates to the required operation time of the process flow and the enhancement of the operation rate of the generated operation list. Refer to the operation flow in FIG. 11, first, two sets $S_1$ and $S_2$ are generated, and the operation list is set to an empty set, and m=1, as shown in step 1110. The set $S_1$ may come from the derived input symbol set p, i.e., $S_1 = Y_p = \{Y_{p,1}, Y_{p,2}, \ldots, Y_{p,L-1}, Y_{p,L}\} = \{0, \ldots, 0, SS_{p,1}, SS_{p,2}, \ldots, SS_{p,k}\}$, wherein the number of zeros before $SS_{p,1}$ is L−k. The set $S_2$ may come from the intermediate symbol set p, i.e., $S_2 = \{IMS_{p,1}, IMS_{p,2}, \ldots, IMS_{p,L}\}$, the operation list OL is an empty set, and may be expressed as NULL, i.e., OL=NULL. Then the intermediate symbol in $S_2$ that can be formed by any element $Y_{p,i}$ in $S_1$, i=1, ..., L is added to the operation list OL and the set $S_1$, as shown in step 1120. In other words, for all elements $IMS_{p,i}$ in the set $S_2$, if $IMS_{p,i} = Y_{p,j} \in S_1$, then $S_2 = S_2 - \{IMS_{p,i}\}$, and a member is concatenated at the end of the operation list OL, i.e., [XOR (p,i) {Y (p, j)}]. In other words, the value of the i-th intermediate symbol in the intermediate symbol set p is the j-th derived input symbol in the derived input symbol set p.

Following step 1120, the m value is increased by 1, then for all elements $IMS_{p,i}$ in the set $S_2$, if IMSp,i can be generated by performing the XOR operation of any m elements (represented by $v_1 \sim v_m$) in the set $S_1$, and m is a positive integer less than n, then the set $S_1 = S_1 \cup \{IMS_{p,i}\}$, the set $S_2 = S_2 - \{IMS_{p,i}\}$, and a member is concatenated at the end of the OL, i.e., [XOR (p,i) {$v_1, \ldots, v_m$}]. In other words, for those intermediate symbol(s) in $S_2$ that can be formed by any m elements in the set $S_1$, the intermediate symbol is added to the operation list OL and the set $S_1$, as shown in step 1130. Then, the value of m is increased by 1, and repeat step 1130, as shown in step 1140, until m is greater than or equal to n.

In other words, the actions of step 1120 to step 1140 are, for those the intermediate symbol(s) in $S_2$ that can be formed by any m elements in the set $S_1$, the intermediate symbol is added to the operation list OL and the set $S_1$, wherein the value of the positive integer m is starting from 1, and the value of m is increased by 1 each time and the process is repeated until the value of m is less than a predetermined positive integer n. Finally, the remaining elements in the set $S_2$ are added to the operation list OL, as shown in step 1150.

FIG. 12 illustrates a flow chart for generating an operation list, according to another exemplary embodiment. First, by using the inputted inverse matrix $M^{-1}$, the intermediate symbols are clustered into groups in accordance with dependency i between intermediate symbols, as shown in step 1210. The dependency level for this dependency i may be represented by such as consecutive positive integers. For example, a matrix D is used to record the Hamming distance of each row and other row within the inverse matrix $M^{-1}$, wherein matrix D [x, y] represents the Hamming distance between row x and y rows in the inverse matrix $M^{-1}$. In each group with dependency i of 1 (the minimum dependency), the intermediate symbols of the most streamlined generation method are all selected and are added to the operation list OL, and the remaining intermediate symbols in the group, based on the dependency of the grouping, are added to the operation list OL, as shown in step 1220. Wherein the intermediate symbols of the most streamlined generation method are the intermediate symbols generated by the OL with the least number of XOR operation. One exemplar is taken for illustration. Assume that the intermediate symbol of the most streamlined generation method is w, and the remaining intermediate symbols in the group are a, b, c, and D [w, a]=i, D [a, b]=i, and D [b, c] then there are dependencies between a and w, between b and a, and between c and b. Therefore, after this intermediate symbol w is added to the operation list OL, the remaining intermediate symbols a, b, c (for example, in an order of a, b, c) in the group are added into the OL operation list, for example, a member denoted by [XOR x {IMS (w), Y(x_w_1), Y (x_w_2), ..., Y(x_w_i,)}] is added into the operation list OL.

In step 1210, for example, it may establish a two-dimensional array S, each element of array S is a set; and then the contents of the array S is established according to the matrix D. For example, an element S [1] [5] of the array S represents a set of assigned number of rows that have Hamming distance 1 with the 5-th rows of the inverse matrix $M^{-1}$; and then a one-dimensional array A is established, wherein the initial value of each element in the array A is an empty set. The data of each element of the array S are then integrated, that is, when an intermediate symbol n located in the set of an element S [i][j], then S [i][j]=S[i][j]∪S[i][n], S[i][n]={ }.

When the element S [1][j] is not an empty set, an intermediate symbol r is taken from the element S [1][j] such that for all members p in S [1][j], the Hamming weight of the r-th row in the inverse matrix $M^{-1}$ is never greater than the Hamming weight of p-th row of the matrix $M^{-1}$. Then, a member is concatenated at the end of the operation list OL, i.e., [Original r { }]. This Original r { } represents that the intermediate symbol IMS (r) is directly added to the operation list OL without performing a further optimization action, that is, only one or more original derived source symbols Y is used to form the IMS(r).

Then, for all member p in the S [1][j], a member is concatenated at the end of the operation list OL, namely [XOR p {IMS (k), SS (q)}], and contents of the set S[i][j] are cleared up. The q represents that the difference of the k-th row of the inverse matrix $M^{-1}$ and the p-th row of the inverse matrix $M^{-1}$ is at the q-th column. The next element S[1][r] is selected and S[1][r] is not an empty set. Then the operations of aforementioned steps are performed until all elements of S[1][r] are empty.

In step 1230, each group with the dependency i is checked whether there is intermediate symbol member(s) with dependency less than i in the operation list OL can be elected. For example, for all intermediate symbols t that was not previously added into the operation list OL, the method tries to find a new intermediate symbol s in the operation list OL such that the Hamming distance v from t (to s) is not greater than dependency i. If more than one intermediate symbols s meet the above conditions, only the intermediate symbol s with the minimum value of v is chosen, so that the operation list OL=OL, [XOR t {IMS (s), Y, (q1) Y (q2), ... }], wherein $q_1$, $q_2$, ... are the column numbers at where the t-th row and s-th row in the inverse matrix $M^{-1}$ are different. That is, all new members of targeting the intermediate symbol t that fit all the aforementioned conditions are added to the end of the operation list OL.

When at least one intermediate symbol with dependency less than i in each group with dependencies i can be elected based on members of the operation list OL, the at least one intermediate symbol of the most streamlined generation method in each group with the dependency less than i is selected from the intermediate symbols generated in the step 1230, and is added into the operation list OL, and the remaining intermediate symbols in the group are added to the operation list OL according to the dependency of grouping, as shown in step 1240. When the intermediate symbol with dependency less than i in each group with dependencies i is unable be selected based on members of the operation list, the intermediate symbol of the most streamlined generation method in each group with dependency i is selected and added into the operation list OL, and the remaining intermediate symbols in the group are added to the operation list OL according to the dependency of grouping, as shown in step 1250.

When the value of the dependency i is less than a predetermined search range n, the method returns to step 1230; when the value of the dependency i is greater than this predetermined search range n, all the remaining intermediate symbols are added into the operation list OL, as shown in step 1260. For example, for index value u of all intermediate symbols have not been added into the operation list OL, a member is concatenated at end of the operation list OL, i.e., [Original u { }].

As a summary, in the exemplary embodiment for generating the operation list of FIG. 12, firstly the inputted inverse matrix $M^{-1}$ is used to cluster the intermediate symbols in accordance with the dependency i and search the intermediate symbol with the smallest dependency (such as the Hamming distance) to insert into the set P whose intermediate symbols are already known how to be generated. Then, the set Q whose intermediate symbols are not known how to be generated and the abovementioned set P are compared to determine whether there exits an intermediate symbol in the set Q having dependency i with an intermediate symbol in the set P, wherein i ranges from 1 to n; the above search starts from dependency i equal to 1 and incremented by 1 in each iteration.

Figure 13A:
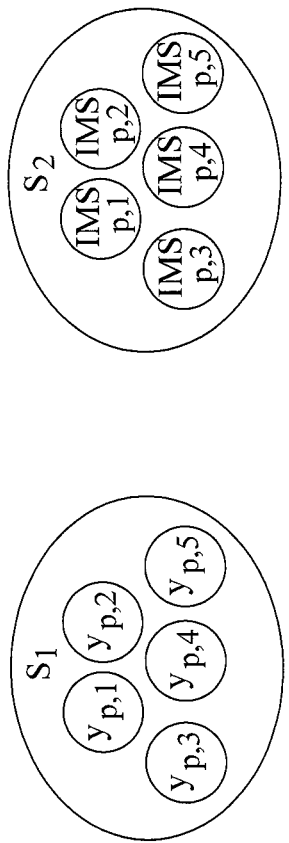

In the following, two exemplars are shown for illustrating each step and operation result for generating the operation list according to FIG. 11 and FIG. 12. FIGS. 13A-13F show each step and its operation result for generating the operation list in FIG. 11, according to an exemplary embodiment. As shown in FIG. 13A (step 1110); the input data includes an input symbol (represented by $M_{s1}$), the inverse matrix $M^{-1}$, and initialized sets $S_1$ and $S_2$, wherein the set $S_1$ comes from the derived input symbol set p, that is, the set $S_1=Y_p=\{Y_{p,1}, Y_{p,2}, Y_{p,3}, Y_{p,4}, Y_{p,5}\}$, the set $S_2$ comes from the intermediate symbol set p, that is, the set $S_2=\{IMS_{p,1}, IMS_{p,2}, IMS_{p,3}, IMS_{p,4}, IMS_{p,5}\}$, and the operation list OL is an empty set NULL, namely OL=NULL. Assume that the search range is 3, then according to step 1120 to step 1140 the method searches if any intermediate symbol in the set $S_2$ may be formed by elements $Y_{p,i}$, i=1, ..., 5, in the set $S_1$.

Figure 13B:
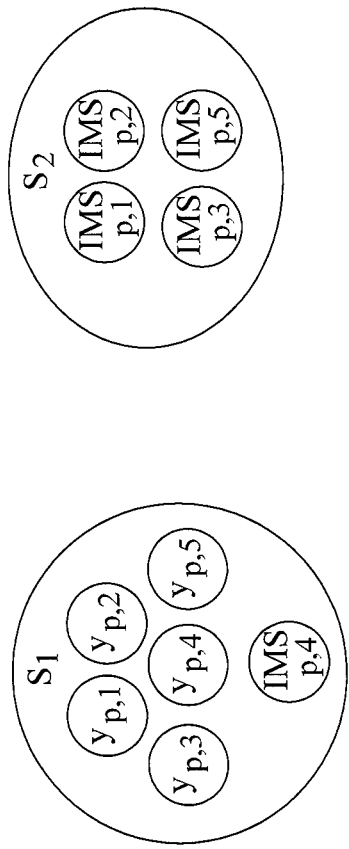

When the search range index is 1, $y_{p,2} \in S1$ and $y_{p,2}=[0\ 1\ 0\ 0\ 0]=IMS_{p,4}$ are found, therefore, $IMS_{p,4}$ is moved from the set $S_2$ to the set $S_1$, as shown in FIG. 13B, at this time $IMS_{p,4}$ is added into the set $S_1$, and $IMS_{p,4}$ is removed from the set $S_2$; and a member [XOR (p,4) {y (p,2)}] is concatenated at the end of the operation list OL, represented that $IMS_{p,4}$ is formed by $y_{p,2}$, so that the operation list OL is shown as follows: OL=[XOR (p,4) {y (p,2)}].

At the moment, the search procedure for the search range index of 1 is completed, and $S_1=\{y_{p,1}, y_{p,2}, y_{p,3}, y_{p,4}, y_{p,5}, IMS_{p,4}\}$, $S_2=\{IMS_{p,1}, IMS_{p,2}, IMS_{p,3}, IMS_{p,5}\}$, OL=[XOR (p,4) {y (p,2)}]. The next step starts from the search procedure for search range index of 2.

Figure 13C:
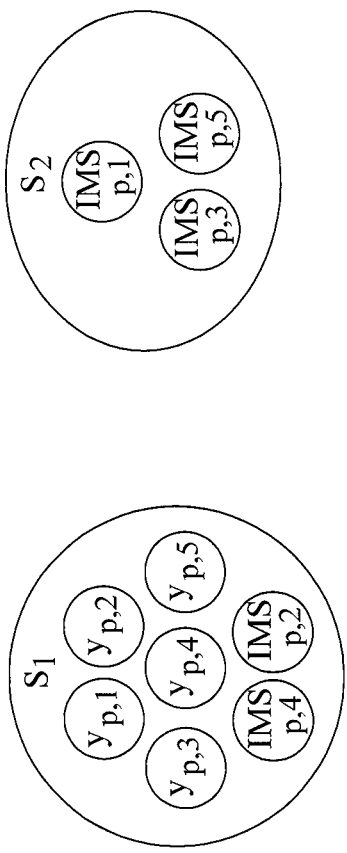

When the search range index is 2, $y_{p,3}, y_{p,4} \in S_1$ and $y_{p,3} \oplus y_{p,4}=[0\ 0\ 1\ 0] \oplus [0\ 0\ 0\ 1\ 0]=[0\ 0\ 1\ 1\ 0]=IMS_{p,2}$ are found; therefore, $IMS_{p,2}$ is moved from the set $S_2$ to the set $S_1$, as shown in FIG. 13c, at this time $IMS_{p,2}$ is added into the set $S_1$, and $IMS_{p,2}$ is removed from the set $S_2$, so $S_1=\{y_{p,1}, y_{p,2}, y_{p,3}, y_{p,4}, y_{p,5}, IMS_{p,4}, IMS_{p,2}\}$, $S_2=\{IMS_{p,1}, IMS_{p,3}, IMS_{p,5}\}$; and a member XOR (p, 2) {y (p, 3), y (p, 4)}] is concatenated at the end of operation list OL, represented that $IMS_{p,2}$ is obtained by performing an XOR operation of $y_{p,3}$ and $y_{p,4}$. Therefore, the operation list OL is shown as follows:

OL=[XOR (p,4) {y (p,2)}], [XOR (p,2) {y (p,3), y (p,4)}].

Figure 13D:
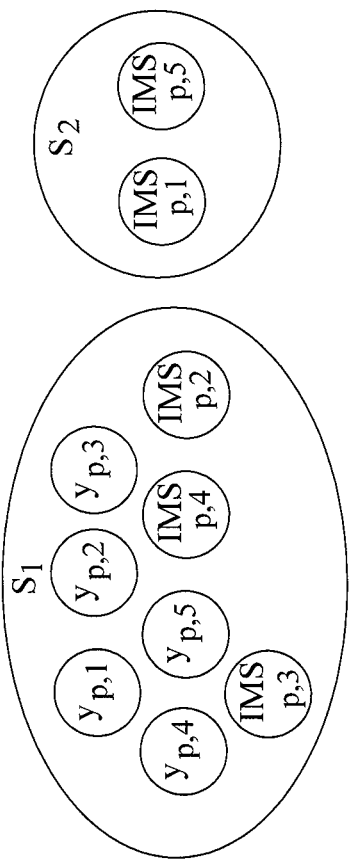
Figure 14A:
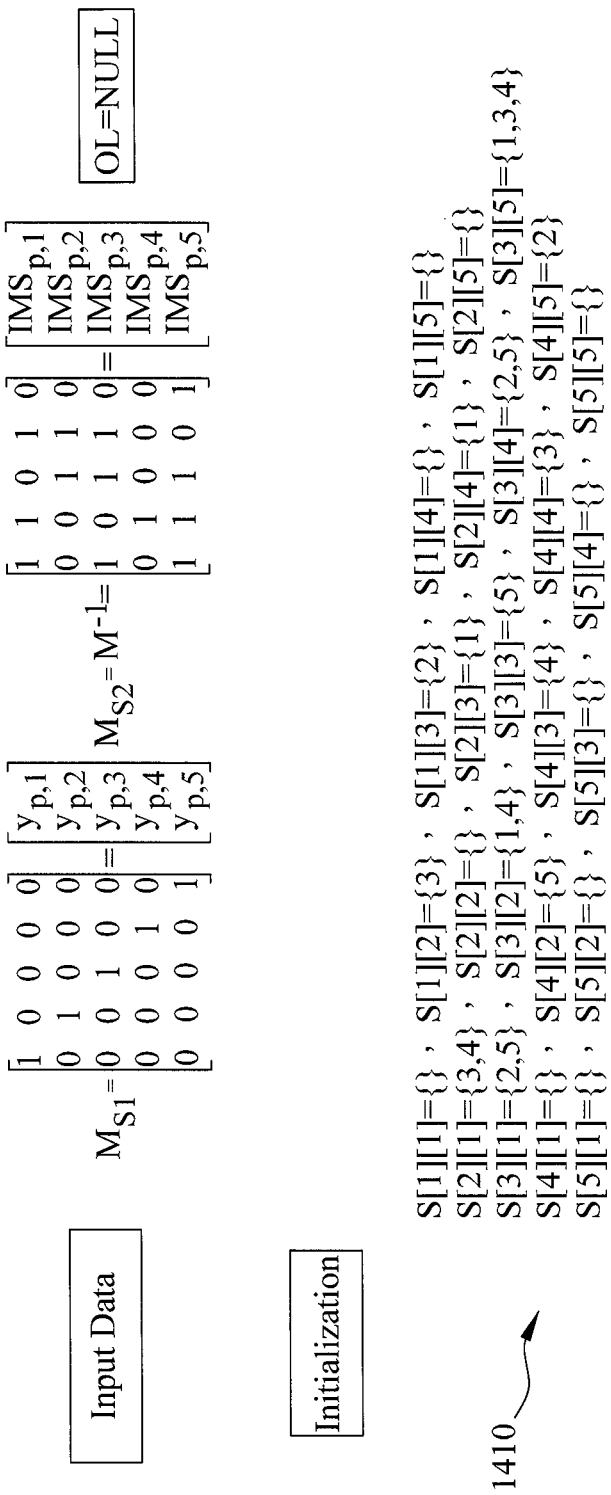
Figure 14C:
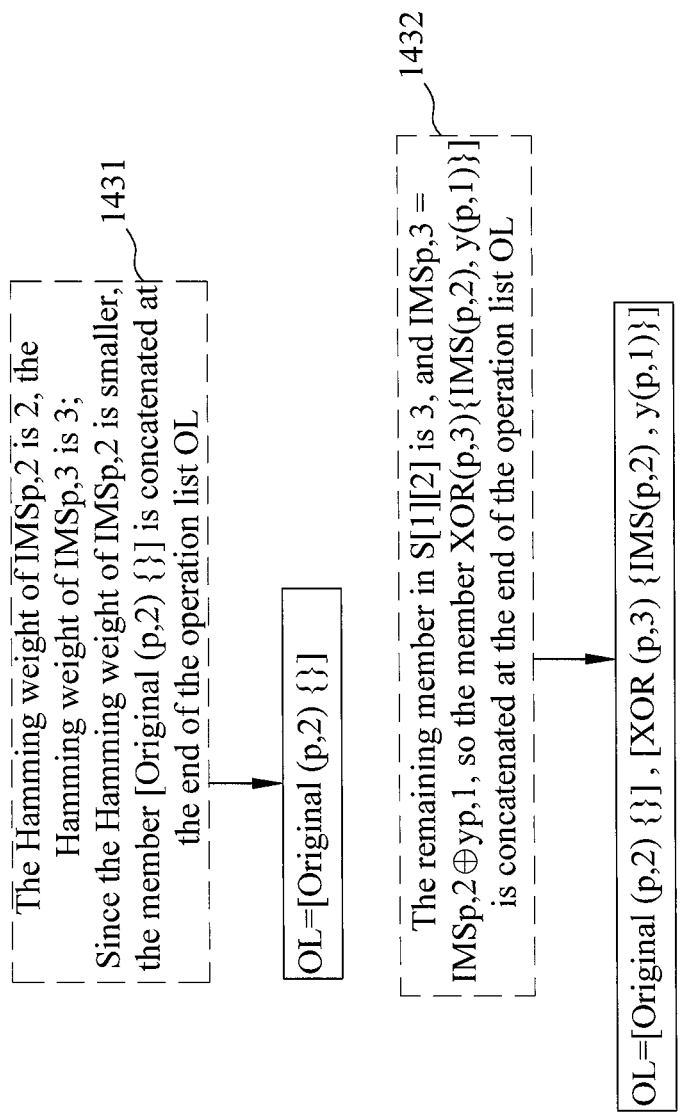

And then $y_{p,1}$, $IMS_{p,2} \in S_1$ and $y_{p,1} \oplus IMS_{p,2}=[1\ 0\ 0\ 0\ 0] \oplus [0\ 0\ 1\ 1\ 0]=[1\ 0\ 1\ 1\ 0]=IMS_{p,3}$ are found, therefore, the $IMS_{p,3}$ is moved from the set $S_2$ to move to set $S_1$, as shown in FIG. 13D, therefore $S_1=\{y_{p,1}, y_{p,2}, y_{p,3}, y_{p,4}, y_{p,5}, IMS_{p,4}, IMS_{p,2}, IMS_{p,3}\}$, $S_2=\{IMS_{p,1}, IMS_{p,5}\}$; and a member [XOR(p,3) {y(p,1), IMS(p,2)}] is concatenated at the end of operation list OL, represented that $IMS_{p,3}$ is obtained by performing an XOR operation of $y_{p,1}$ and $IMS_{p,2}$, so the operation list OL is shown as follows:

OL=[XOR(p,4){y(p, 2)}], [XOR(p,2){y(p,3), y(p,4)}], [XOR(p,3){y(p,1), IMS(p,2)}].

The searching for search range index of 2 is completed, and $S_1=\{y_{p,1}, y_{p,2}, y_{p,3}, y_{p,4}, y_{p,5}, IMS_{p,4}, IMS_{p,2}, IMS_{p,3}\}$, $S_2=\{IMS_{p,1}, IMS_{p,5}\}$, OL=[XOR(p,4){y(p,2)}], [XOR(p,2) {y(p,3), y(p,4)}], [XOR(p,3) {y(p,1), IMS(p,2)}]. The next step starts from the searching for the search range index of 3.

When the search range index is 3, $y_{p,1}, y_{p,2}, y_{p,4} \in S_1$ and $y_{p,1} \oplus y_{p,2} \oplus y_{p,4}=[1\ 0\ 0\ 0\ 0] \oplus [0\ 1\ 0\ 0\ 0] \oplus [0\ 0\ 0\ 1\ 0]=[1\ 1\ 0\ 1\ 0]=IMS_{p,1}$ are found, therefore, $IMS_{p,1}$ is moved from the set $S_2$ to the set $S_1$, as shown in FIG. 13E, so $S_1=\{y_{p,1}, y_{p,2}, y_{p,3}, y_{p,4}, y_{p,5}, IMS_{p,4}, IMS_{p,2}, IMS_{p,3}, IMS_{p,1}\}$, $S_2=\{IMS_{p,5}\}$; and a member XOR[(p,1) {y(p,1), y(p,2), y(p,4)}] is concatenated at the end of the operation list OL, represented that $IMS_{p,1}$ is obtained by an XOR operation of $y_{p,1}, y_{p,2}, y_{p,4}$. Therefore, the operation list OL is shown as follows:

OL=[XOR(p,4) {y(p,2)}], [XOR(p,2) {y(p,3), y(p,4)}], [XOR(p,3) {y(p,1), IMS(p,2)}], [XOR (p,1){y(p,1), y(p,2), y(p,4)}].

At the moment, the search procedure for the search range index of 3 is completed, and the loop termination condition is achieved.

When the loop is terminated, only $IMS_{p,5}$ is remained in the set $S_2$. According to step 1150, $IMS_{p,5}$ is moved from the set $S_2$ to the $S_1$, as shown in FIG. 13F, so $S_1=\{y_{p,1}, y_{p,2}, y_{p,3}, y_{p,4}, y_{p,5}, IMS_{p,4}, IMS_{p,2}, IMS_{p,3}, IMS_{p,1}, IMS_{p,5}\}$, $S_2=\{\ \}$; and a member [Origin (p,5){ }] is concatenated at the end of the operation list OL, represented that $IMS_{p,5}$ is not optimized and the original formation is used. Therefore, the final obtained operation list OL is shown as follows:

L=[XOR (p,4) {y(p,2)}], [XOR(p,2) {y(p,3), y(p,4)}], [XOR (p,3) {y(p,1), IMS(p,2)}], [XOR (p,1){y(p,1), y(p,2), y(p,4)}], [Origin (p,5) { }].

FIG. 14A-FIG. 14E show each step and its operation result for generating the operation list in FIG. 12, according to an exemplary embodiment. Wherein the input data and the initial assumptions are the same as the exemplar of FIG. 13, namely, input symbol (represented by $M_{s1}$), and the inverse matrix $M^{-1}$, the set $M_{s1}=Y_p=\{_{p,1}, Y_{p,2}, Y_{p,3}, Y_{p,4}, Y_{p,5}\}$, the set $M_{s2}$ comes from the intermediate symbol of the set p and the set $M_{s2}=M^{-1}=\{IMS_{p,1}, IMS_{p,2}, IMS_{p,3}, IMS_{p,4}, IMS_{p,5}\}$, the operation list OL=NULL. Assume that the search range index is 3, then starts from the step 1210, the method does clustering according to dependency i of each row in $M^{-1}$. In this example, first a two-dimensional array S is established, each element S[i][j] in the array S is a set, where $1 \leq i, j \leq 5$. Contents of the array S is established according to the aforementioned matrix D. In FIG. 14, the contents of each element S[i][j] of the array S is listed after the initialized step 1210, as indicated by an arrow 1410. For S[3][2]={1,4} taken as an example, the equation indicates that the rows in the $M^{-1}$ with the Hamming distance 3 from the second row are the first and the fourth rows. Then, the next step is performing integration for the data of each element S[i][j] in the array S.

The integration scheme is as previously described, when an intermediate symbol n is located in the set of an element S[i][j], then S[i][j]=S[i][j]∪S[i][n], S[i][n]={ }, as the 7 items shown in FIG. 14B, indicated by the label 1421 to label 1427, respectively.

As described by the label 1421, since 3∈S[1][2], so S[1][3] is merged into S[1][2], and S[1][3] is empty; so S[1][2]=S[1][2]∪S[1][3]={2,3}, S[1][3]={ }. As described by the label 1422, since 3∈S[2][1] and 4∈S[2][1], so S[2][3] and S[2][4] are merged into S[2][1], and S[2][3] and S[2][4] are empty, so S[2][1]=S[2][1]∪S[2][3]∪S[2][4]={1,3,4}, S[2][3]=S[2][4]={ }. As described in the label 1423, since 2∈S[3][1], S[3][2] is merged into S[3][1], and S[3][2] is empty, so S[3][1]=S[3][1]∪S[3][2]={1,2,4,5}, S[3][2]={ }. As described in the label 1424, since 5∈S[3][1], so S[3][5] is merged into S[3][1], and S[3][5] is empty, so S[3][1]=S[3][1]∪S[3][5]={1,2,3,4,5}, S[3][5]={ }. As described in the label 1425, since 3∈S[3][1] and 4∈S[3][1], so S[3][3] and S[3][4] are merged into S[3][1], and S[3][3] and S[3][4] are empty, so S[3][1]=S[3][1]∪S[3][3]∪S[3][4]={1,2,3,4,5}, S[3][3]=S[3][4]={ }. As described in the label 1426, since 5∈S[4][2], so S[4][5] is merged into S[4][2], and S[4][5] is empty, so S[4][2]=S[4][2]∪S[4][5]={2,5}, S[4][5]={ }. As described in the label 1427, since 4∈S[4][3], so S[4][4] is merged into S[4][3], and S[4][4] is empty, so S[4][3]=S[4][3] ∪S[4][4]={3,4}, [4][4]={ }.

After integrating data of each element S[i][j] of the array S, in accordance with step 1220, the next step is to select intermediate symbol(s) of the most streamlined generation method from each group with dependency i of 1 (minimum dependency) and add the intermediate symbol(s) to the operation list OL, and add remaining intermediate symbols in the group into the operation list OL based on dependency of grouping. After the integration of the array S, the non-empty set with the dependency 1 is the set S[1][2]={2,3}, so as described by the label 1431 and label 1432, respectively, in FIG. 14C. As described by the label 1431, the Hamming weight of $IMS_{p,2}$ is 2, and the Hamming weight of $IMS_{p,3}$ is 3; since the Hamming weight of $IMS_{p,2}$ is smaller, the member [Original (p,2) { }] is concatenated at the end of the operation list OL, i.e., OL=[Original(p,2) { }]. As described by the label 1432, the remaining member in S[1][2] is 3, and $IMS_{p,3}=IMS_{p,2} \oplus y_{p,1}$, so the member XOR(p,3){IMS(p,2), y(p,1)}] is concatenated at the end of the operation list OL, i.e., OL=[Original (p,2){ }], [XOR (p,3) {IMS (p,2), y(p,1)}]. At the moment, the set for the search range index (i.e., dependencies) of 1 are all completed, the next step starts from the dependency of 2.

When the search range index (i.e., dependency) is 2, the non-empty set with dependency 2 is the set S[2][1]={3}, and $IMS_{p,3}$ has been added to the operation list OL. Therefore, as shown in FIG. 14D, members in S [2][1] have not yet been added to the OL are 1 and 4. Since $IMS_{p,1}=IMS_{p,3} \oplus y_{p,2} \oplus y_{p,3}$ and $IMS_{p,4}=IMS_{p,1} \oplus y_{p,1} \oplus y_{p,4}$, two members [XOR (p,1){IMS(p,3), y(p,2), y(p,3)}] and [XOR(p,4){IMS(p,1), y(p,1), y(p,4)}] are concatenated at the end of the operation list OL. Therefore, the operation list OL=[Original (p,2) { }], [XOR (p,3) {IMS (p,2), y (p,1)}], [XOR(p,1) {IMS(p,3), y (p,2), y(p,3)}], [XOR (p,4) {IMS (p,1), y (p,1), y (p,4)}]. The set for the search range index (i.e., dependency) of 2 are all completed, the next step starts from dependency of 3.

When the search range index (i.e., dependency) is 3, the non-empty set with dependency 3 is the set S[3][1]={1}, and $IMS_{p,1}$ has been added to the operation list OL. Therefore, as shown in FIG. 14E, the member of S[3][1] has not yet been added into the OL is 5. Since $IMS_{p,5}=IMS_{p,1} \oplus y_{p,3} \oplus y_{p,4} \oplus y_{p,5}$, so a member [XOR (p,5) {IMS(p, 1), y,(p, 3), y(p, 4), y(p, 5)}] is concatenated at the end of the operation list OL. At the moment, the set for the search range index (i.e., dependencies) of 3 are all completed, and all IMS have been added into the operation list OL. Therefore, the final obtained operation list OL is shown as follows:
OL=[Original (p,2) { }], [XOR (p,3) {IMS(p,2), y(p,1)}], [XOR (p,1) {IMS(p,3), y(p,2), y(p,3)}], [XOR (p,4) {IMS(p, 1), y(p,1), y(p,4)}], [XOR (p,5) {IMS(p,1), y(p,3), y(p,4), y(p,5)}].

Figure 15A:
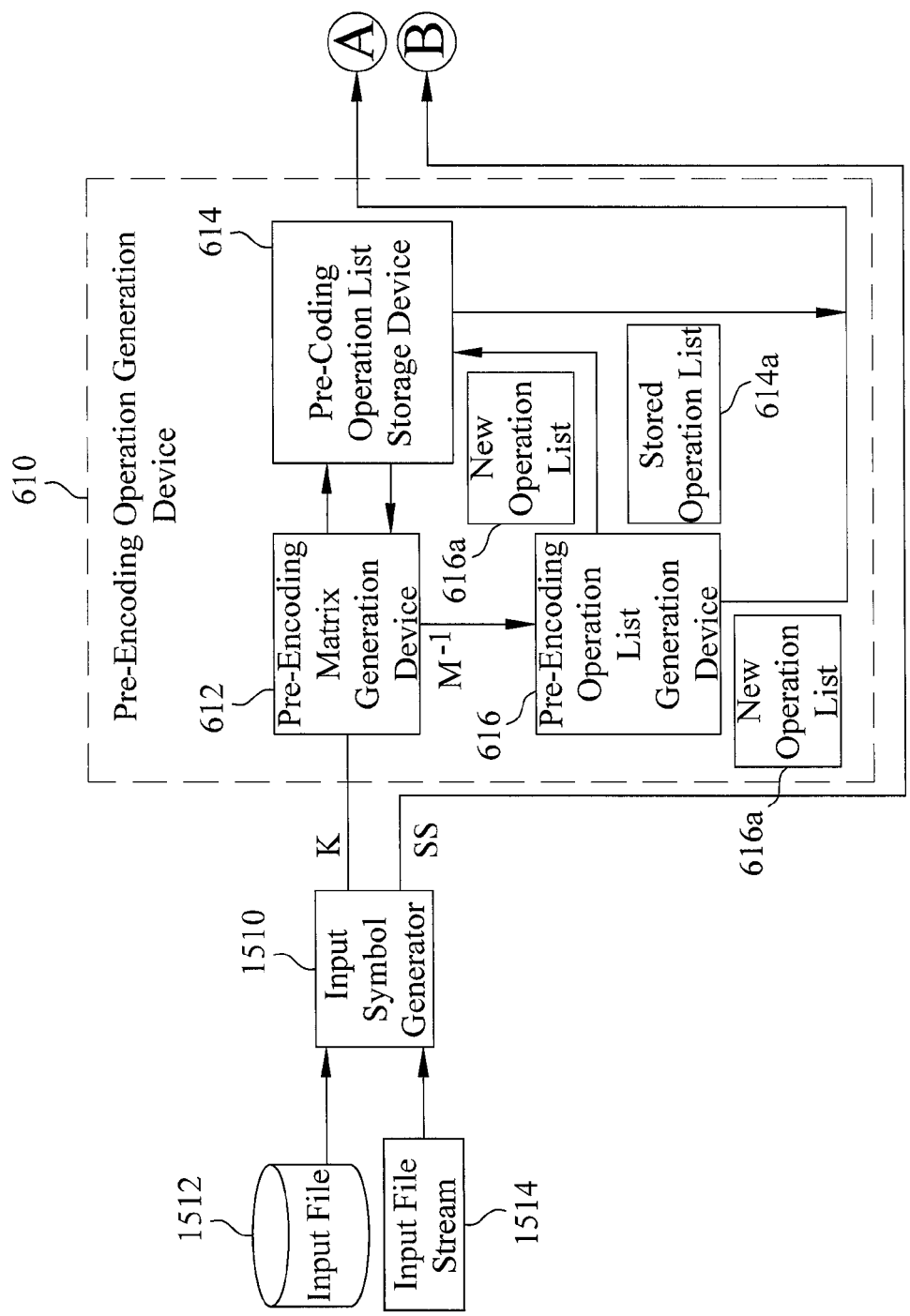
FIG. 15A-FIG. 15B show an application scenario in FIG. 6, according to an exemplary embodiment.
Figure 15B:
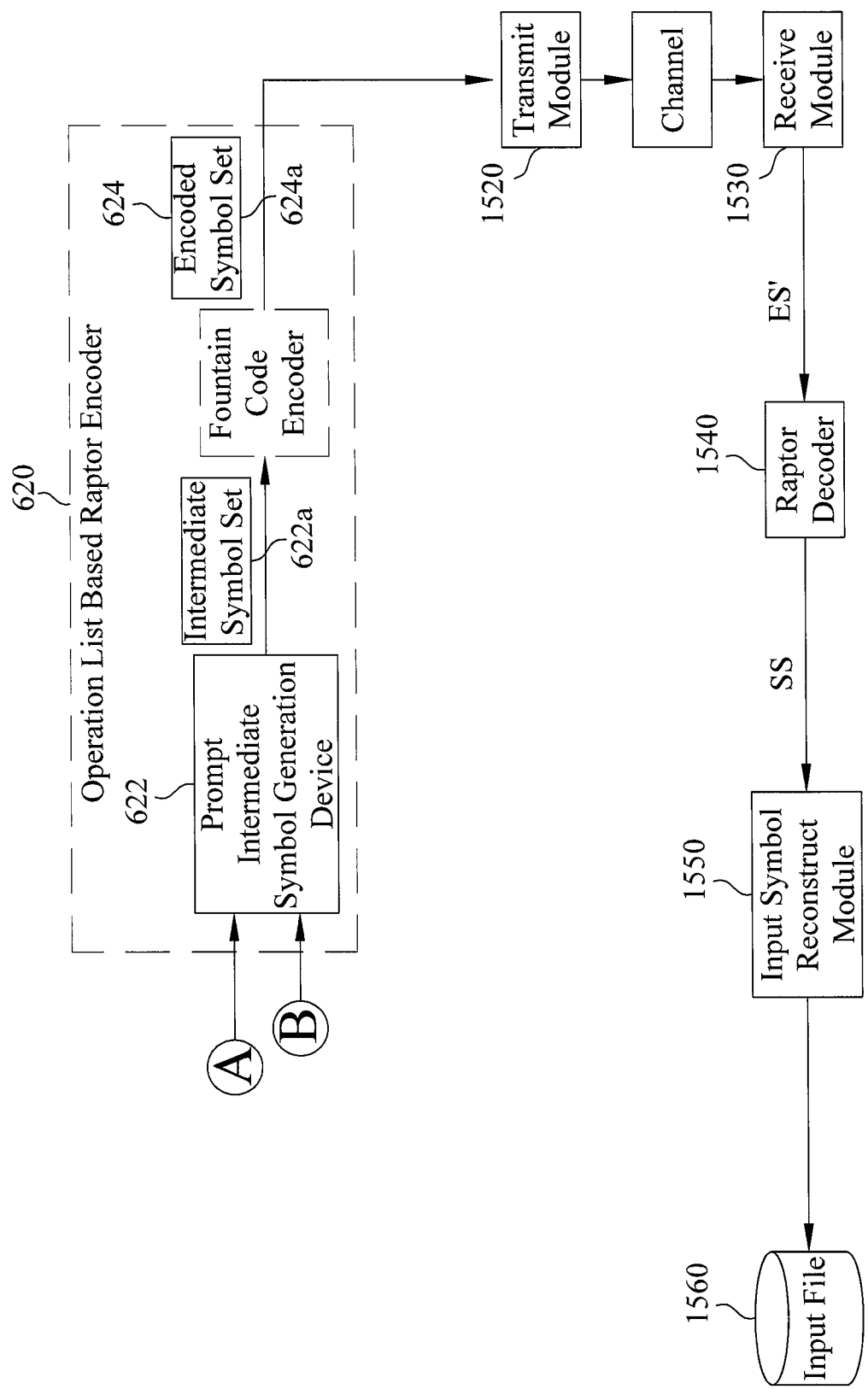
Figure 16A:
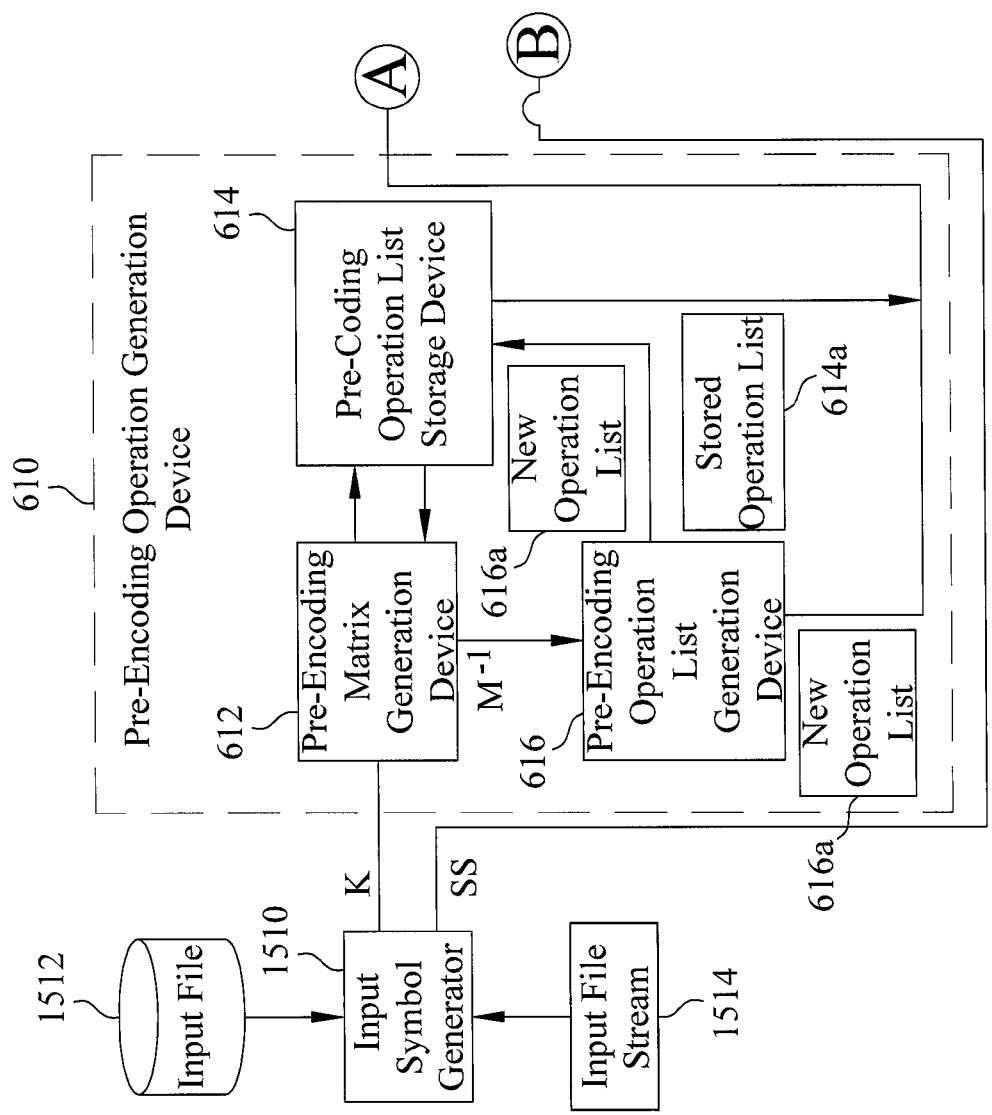
FIG. 16A-FIG. 16B show an application scenario in FIG. 7, according to an exemplary embodiment.
Figure 16B:
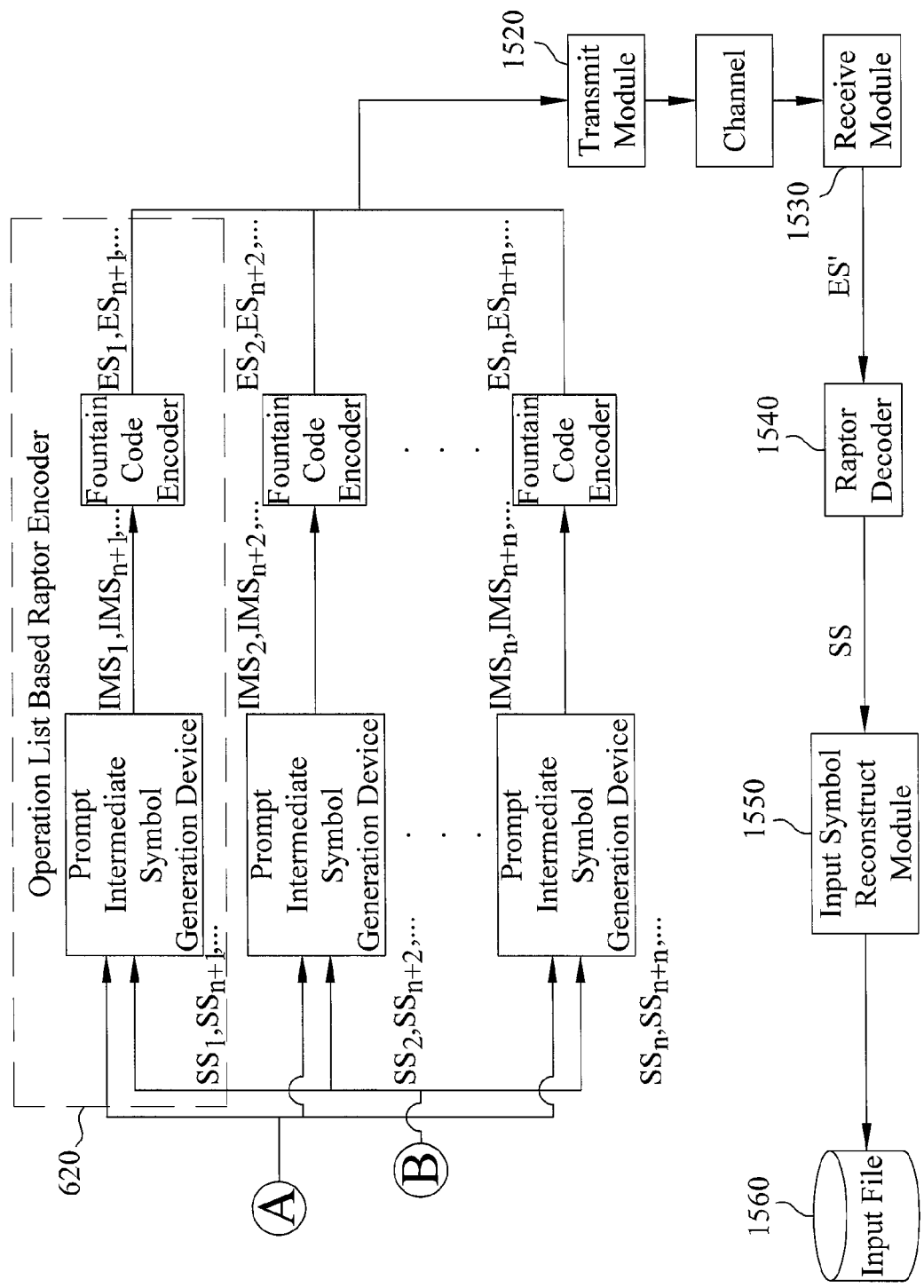

FIG. 15A-FIG. 15B and FIG. 16A-FIG. 16B show two application scenarios in FIG. 6 and FIG. 7, respectively, according to an exemplary embodiment. As shown in the exemplar of FIG. 15A-FIG. 15B, in the actual application scenario, it may employ an input symbol generator 1510 to generate the block length k and a series of source symbol sets SS, and input the block length k to the pre-encoding operation list generation device 616 in pre-encoding operation generation device 610, and input a series of source symbol sets SS to the prompt intermediate symbol generation device 622 of operation list based Raptor code encoder 620 to generate multiple intermediate symbol lists, then output to the fountain code encoder 624 for encoding. Or as shown in the exemplar of FIG. 16A-FIG. 16B, the input symbol generator 1510 may input in parallel the block length k to the pre-encoding operation list generation device 616 in pre-encoding generation device 610, and input in parallel a series of source symbol sets SS to n prompt intermediate symbol generation devices of operation list based Raptor code encoder 620 to generate in parallel multiple intermediate symbol lists, then output in parallel to multiple fountain code encoders for encoding.

The input symbol generator 1510 may be connected to an input file 1512 of the encoding end, or an input file stream 1514. The input file 1512 or the input file stream 1514 of the encoding end is one of the data sources for encoding, and may be of the form of a static file. The input symbol generator 1510, according to predetermined parameters, may cut the received original uncoded data into one or more desired input symbol sets in order to facilitate the following encoding processing. Each operation list based Raptor code encoder may include a prompt intermediate symbol generation device and a fountain code encoder 624. The transmit module 1520 packs the encoded symbol set generated by the operation list based Raptor code encoder into the form of network packets, and after transmits to a receive module 1530 through a channel, the receive module 1530 converts the packets into the received encoded symbol set ES', to facilitate the follow-up decoding operation of the Raptor decoder 1540. The decoded source symbol set SS is then re-transmitted to an input symbol reconstruct module 1550 to merge one or more input symbol sets to recover the original file. The original file after decoding may be stored in a file (for example, the input file 1560) at the decoding end.

In many application environments, the number of changes for the value of block length K is very rare. Therefore, according to the above exemplary embodiments, consecutive input symbols with same value of K may respectively be assigned to multiple prompt intermediate symbol generation devices to generate in parallel multiple intermediate symbol lists, output in parallel to each corresponding fountain code encoder for encoding, and generate the final encoded symbol set, so that such parallelized encoding operations may speed up the operation speed of the encoding. Based on the above mentioned operations of the pre-encoding matrix generation device in FIG. 8, the exemplary embodiments also support variable block lengths. Multiple operation lists corresponding to different K values may separately stored in the pre-coding operation list storage device. When same value of block length K is inputted, re-calculating the operation list is unnecessary.

In summary, the exemplary embodiments provide an apparatus and method for accelerating Raptor code encoding. This technology refines the system architecture of the pre-encoding operation, and completes the Gaussian elimination operations in advance for data with same source block length. Its design discloses an optimized operation list to replace the complex operation process of multiplying the inverse matrix $M^{-1}$ with the input symbols Y. In other words, the operation process for the matrix multiplication of the inverse matrix $M^{-1}$ and the input symbols Y is optimized by converting matrix multiplication into the matrix operations based on operation lists, which requires fewer operations. Hence, the parallelized and optimized operations for the Raptor code or the RaptorQ code encoding may be achieved, and also the process of the Raptor code or the RaptorQ code encoding may be further accelerated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An apparatus for accelerating the encoding of Raptor code, comprising:
   a pre-coding operation list (OL) storage device for storing at least one operation list, and each of the at least one operation list has a corresponding block length;
   a pre-encoding matrix generation device configured to generate an encoding matrix M corresponding to an inputted block length and compute an inverse matrix $M^{-1}$, or make the pre-coding operation list storage device output an operation list corresponding to the inputted block length;
   a pre-encoding OL generation device, based on the encoding matrix M or the inverse matrix $M^{-1}$, generating a new operation list (new OL); and
   at least one prompt intermediate symbol generation device, based on one of the two operation lists and at least one inputted source symbol set, generating at least one intermediate symbol set to provide to at least one fountain code encoder for encoding.

2. The apparatus as claimed in claim 1, wherein said apparatus is implemented with a parallelized hardware architecture, and said at least one prompt intermediate symbol generation device is a plurality of prompt intermediate symbol generation devices, and said at least one fountain code encoder is a plurality of fountain code encoders.

3. The apparatus as claimed in claim 2, wherein in said parallelized hardware architecture, a plurality of input source symbol sets are arranged to input in parallel to said plurality of prompt intermediate symbol generation devices to generate in parallel a plurality of intermediate symbol lists and output in parallel to said plurality of fountain code encoders for encoding.

4. The apparatus as claimed in claim 2, wherein said pre-encoding operation list generation device provides in parallel at least one generated operation list to said plurality of prompt intermediate symbol generation devices.

5. The apparatus as claimed in claim 1, wherein when said inputted block length is stored in said pre-coding operation list storage device, said pre-encoding matrix generation device makes said pre-coding operation list storage device output the operation list corresponding to said inputted block length.

6. The apparatus as claimed in claim 1, wherein said apparatus further includes said at least one fountain code encoder to encode said at least one intermediate symbol set to generate at least one encoded symbol set.

7. The apparatus as claimed in claim 1, wherein when said inputted block length is not stored in said pre-coding operation list storage device, said pre-encoding matrix generation device generates said encoding matrix M and computes the inverse matrix $M^{-1}$.

8. The apparatus as claimed in claim 1, wherein said pre-encoding operation list generation device stores said new operation list and said inputted block length into said pre-coding operation list storage device.

9. The apparatus as claimed in claim 8, wherein a content of each operation list of a plurality of operation lists stored in the pre-coding operation list storage device is an execution order of a plurality of XOR operations required for performing a pre-encoding operation.

10. The apparatus as claimed in claim 1, wherein said pre-encoding operation list generation device receives the encoding matrix M generated by the pre-encoding matrix generation device and executes a Gaussian elimination method for an encoding stage of Raptor code, and generates the new operation list when said Gaussian elimination method is finished.

11. The apparatus as claimed in claim 10, wherein during the execution of the Gaussian elimination method, the pre-encoding operation list generation device, through recording an order of a series of XOR operations and permutation operations performed for at least one row of the encoding matrix M, generates the new operation list when the Gaussian elimination method is finished.

12. A method for accelerating the encoding of Raptor code, comprising:
configuring a pre-coding operation list storage device to store at least one operation list, and each of the at least one operation list having a corresponding block length;
when an inputted block length is stored in the pre-coding operation list storage device, outputting a stored operation list corresponding to the inputted block length by the pre-coding operation list storage device; otherwise, generating a new operation list by using a pre-encoding operation list generation device after computing an encoding matrix M or an inverse matrix $M^{-1}$; and
based on at least one inputted source symbol list and one of the two operation lists, generating at least one intermediate symbol set to provide to at least one fountain code encoder for encoding through at least one prompt intermediate symbol generation device.

13. The method as claimed in claim 12, wherein said method provides in parallel said one of the two operation lists to a plurality of prompt intermediate symbol generation devices.

14. The method as claimed in claim 13, wherein said method further includes:
arranging a series of input source symbol sets to input in parallel to said plurality of prompt intermediate symbol generation devices, generate in parallel a plurality of intermediate symbol lists and output in parallel to a plurality of fountain code encoders for encoding.

15. The method as claimed in claim 12, wherein a content of each operation list of a plurality of operation lists stored in the pre-coding operation list storage device is an execution order of XOR operations required for performing a pre-encoding operation, and a data structure of the operation list is formed by a series of three fields including an operation, a target, and an empty set or a set of at least one source set.

16. The method as claimed in claim 15, wherein in the data structure of the operation list, the operation in said operation list has a first option of an XOR operation, and a second option of an original operation.

17. The method as claimed in claim 16, wherein said the set of at least one source set is a source data set required for the first option of the XOR operation.

18. The method as claimed in claim 15, wherein in the data structure of the operation list, said target is an assigned number of an intermediate symbol in the at least one intermediate symbol set.

19. The method as claimed in claim 12, wherein said method further includes:
storing the new operation list and the inputted block length to the pre-coding operation list storage device.

20. The method as claimed in claim 12, wherein generating said new operation list further includes:
generating two sets $S_1$ and $S_2$, and making the new operation list be an empty set, wherein set $S_1$ comes from a derived input symbol set of at least one derived input symbol list, and set $S_2$ comes from an intermediate symbol set of the at least one intermediate symbol set;
selecting from set $S_2$ at least one intermediate symbol formed by any m elements in set $S_1$ and adding the at least one intermediate symbol into the new operation list and set $S_1$, wherein a value of m starts from 1 and the selecting and the adding steps are repeated with the value of m incremented by 1 until the value of m is not less than a predetermined positive integer n, wherein m is an integer; and
adding one or more remaining elements of set $S_2$ to the new operation list.

21. The method as claimed in claim 12, wherein generating the new operation list further includes:
clustering all intermediate symbols in at least one intermediate symbol set into at least one group according to a dependency i among the all intermediate symbols by using the inverse matrix $M^{-1}$, i is a positive integer;
selecting one or more intermediate symbol from each of the at least one group with a smallest dependency and adding to the new operation list, and based on the dependency i of grouping, adding at least one intermediate symbol remained in the group to the new operation list;
when the dependency i is less than a predetermined search range, repeating a step of:
incrementing the dependency i by 1, and when it is allowed to select at least one intermediate symbol with a corresponding dependency less than the dependency i in each group of the at least one group with the dependency i according to the new operation list, selecting at least one intermediate symbol from at least one selected intermediate symbol with the corresponding dependency less than the dependency i and adding to the new operation list, and based on the dependency i of grouping, adding at least one remaining intermediate symbol in those group(s) with the corresponding dependency less than i to the new operation list; otherwise, selecting at least one intermediate symbol directly from each group with the dependency i of the at least one group and adding to the new operation list, and based on the dependency i of grouping, adding at least one remaining intermediate symbol in the group with the dependency i to the new operation list; and when the dependency i is greater than or equal to the predetermined search range, adding all of at least one remaining intermediate symbol to the new operation list.

22. The method as claimed in claim 12, wherein said method generates the new operation list based on the inverse matrix $M^{-1}$ by using the pre-encoding operation list generation device.

23. The method as claimed in claim 12, wherein after the method calculates the encoding matrix M, the pre-encoding operation list generation device executes an operation of a Gaussian elimination method for an encoding stage of Raptor code, and generates the new operation list when the operation of the Gaussian elimination method is finished.

24. The apparatus as claimed in claim 23, wherein in the Gaussian elimination method, the pre-encoding operation list generation device, through recording an order of a series of at least one XOR operation and at least one permutation operation performed for at least one row of the encoding matrix M, generates the new operation list when the operation of the Gaussian elimination method is finished.

\* \* \* \* \*